US012811568B2

(12) United States Patent
Nguyen et al.

(10) Patent No.: US 12,811,568 B2
(45) Date of Patent: Nov. 24, 2026

(54) MULTI-MODE SAW FILTERS WITH MULTI-TRACK, UNIFIED INSULATING ELEMENTS AND RELATED METHODS OF MANUFACTURE

(71) Applicant: RF360 Singapore Pte. Ltd., Singapore (SG)

(72) Inventors: Ngoc Tinh Nguyen, Antibes Juan-les-Pins (FR); Jacques-Antoine Damy, Nice (FR); Olivier Tristan, Antibes (FR); Xavier Perois, Mouans Sartoux (FR); Charles Binninger, Saint-Jeannet (FR)

(73) Assignee: RF360 Singapore Pte. Ltd., Republic Plaza (SG)

( * ) Notice: Subject to any disclaimer, the term of this patent is extended or adjusted under 35 U.S.C. 154(b) by 134 days.

(21) Appl. No.: 18/824,049

(22) Filed: Sep. 4, 2024

(65) Prior Publication Data

US 2026/0066875 A1 Mar. 5, 2026

(51) Int. Cl.
*H03H 9/64* (2006.01)
*H03H 3/08* (2006.01)
*H03H 9/145* (2006.01)

(52) U.S. Cl.
CPC ................ *H03H 9/64* (2013.01); *H03H 3/08* (2013.01); *H03H 9/145* (2013.01)

(58) Field of Classification Search
CPC ............. H03H 9/64; H03H 3/08; H03H 9/145
USPC ...................... 333/186, 193; 310/311, 313 R
See application file for complete search history.

(56) References Cited

U.S. PATENT DOCUMENTS

2007/0018756 A1 1/2007 Fujii et al.
2012/0098618 A1 4/2012 Tanaka
2017/0250674 A1 8/2017 Takamine et al.
2018/0145659 A1 5/2018 Okude
(Continued)

FOREIGN PATENT DOCUMENTS

DE 102016123701 A1 6/2018

OTHER PUBLICATIONS

International Search Report and Written Opinion for International Patent Application No. PCT/SG2025/050508, mailed Oct. 31, 2025, 18 pages.

*Primary Examiner* — Andrea Lindgren Baltzell
*Assistant Examiner* — Victor Cole
(74) *Attorney, Agent, or Firm* — W&T

(57) ABSTRACT

On a first side of a row of interdigital transducers (IDTs) in a multi-mode SAW filter, which includes dual-mode SAW (DMS) filters, a first interconnect is coupled to the tracks of first IDTs and a second interconnect is coupled to tracks of second IDTs that alternate with the first IDTs in the IDT row. Consequently, the first and second interconnects may overlap at multiple overlap locations along the first side of the IDT row. A multi-mode SAW filter disclosed herein includes a unified insulating element that extends over multiple tracks on the first side of the IDT row to insulate the first interconnect and second interconnect from each other at multiple overlap locations. Employing a unified insulating element extending over multiple overlap locations as opposed to employing multiple discrete insulating elements formed at each of the overlap locations avoids the manufacturing reliability problems of discrete insulating elements.

15 Claims, 13 Drawing Sheets

(56) References Cited

U.S. PATENT DOCUMENTS

| | | | | |
|---|---|---|---|---|
| 2019/0089334 | A1 | 3/2019 | Koyanagi | |
| 2023/0246628 | A1* | 8/2023 | Noguchi | H03H 9/02992 333/193 |

* cited by examiner

RELATED ART

MULTI-MODE SAW FILTERS WITH MULTI-TRACK, UNIFIED INSULATING ELEMENTS AND RELATED METHODS OF MANUFACTURE

TECHNICAL FIELD

The technology of the disclosure relates generally to surface acoustic wave (SAW) filters and, more particularly, to multi-mode SAW filters, including dual-mode SAW (DMS) filters.

BACKGROUND

Electronic devices use radio-frequency (RF) signals to communicate information. These radio-frequency signals enable users to talk with friends, download information, share pictures, remotely control household devices, and receive global positioning information, just to name a few consumer-oriented examples. To transmit or receive the radio-frequency signals within a given frequency band, the electronic device may use filters to pass signals within the frequency band and suppress (e.g., attenuate) jammers or noise having frequencies outside of the frequency band. It can be challenging, however, to design a filter that provides filtering for radio-frequency applications, including those that utilize frequencies above 100 megahertz (MHz).

SUMMARY

Aspects disclosed herein include multi-mode surface acoustic wave (SAW) filters with multi-track, unified insulating elements. Related methods of manufacturing a multi-mode SAW filter with unified insulating elements are also disclosed. Multi-mode SAW filters may include multiple interdigital transducers (IDTs) disposed in an IDT row with a first track of each of the IDTs on a first side of the row and a second track of each IDT on a second side of the row. A first interconnect is coupled to the first tracks of a plurality of first IDTs of the IDT row, and a second interconnect is coupled to first tracks of a plurality of second IDTs and the second IDTs may alternate with the first IDTs. Consequently, the first and second interconnects may overlap each other at multiple overlap locations along the first side of the IDT row. An exemplary multi-mode SAW filter disclosed herein includes a unified insulating element that extends over multiple tracks on the first side of the IDT row to insulate the first interconnect and second interconnect from each other at multiple overlap locations. Employing a unified insulating element extending over multiple overlap locations as opposed to a discrete insulating element formed at each of the overlap locations avoids the manufacturing reliability problems of discrete insulating elements and may provide a reduction in area because the unified insulating element allows the interconnects to be located on top of each other. In some examples, a second unified insulating element is disposed between the second interconnect and a third interconnect on a second side of the IDT row.

In this regard, in exemplary aspects, a multi-mode SAW filter is disclosed. The multi-mode SAW filter includes an interdigital transducer (IDT) row (IDT row) including first IDTs alternately disposed with second IDTs, each IDT of the IDT row including a first-side track on a first side of the IDT row and a second-side track on a second side of the IDT row opposite to the first side. The multi-mode SAW filter further includes a first interconnect on the first side of the IDT row and electrically coupled to the first-side track of a first one of the first IDTs and first-side track of a second one of the first IDTs, and a second interconnect on the first side of the IDT row and coupled to the first-side track of a first one of the second IDTs disposed between the first one of the first IDTs and the second one of the first IDTs. The multi-mode SAW filter further includes a first overlap location wherein the second interconnect overlaps the first interconnect coupled to the first-side track of the first one of the first IDTs, a second overlap location wherein the second interconnect overlaps the first interconnect coupled to the first-side track of the second one of the first IDTs; and a first unified insulating element disposed between the first interconnect and the second interconnect in the first overlap location and the second overlap location.

In this regard, in one aspect, a method of manufacturing a multi-mode SAW filter, the method comprising is disclosed. The method includes forming an interdigital transducer (IDT) row (IDT row) including first IDTs alternately disposed with second IDTs, each IDT of the IDT row including a first-side track on a first side of the IDT row and a second-side track on a second side of the IDT row opposite to the first side. The method further includes forming a first interconnect extending on the first side of the IDT row and electrically coupled to the first-side track of a first one of the first IDTs and the first-side track of a second one of the first IDTs, and forming a second interconnect extending on the first side of the IDT row and coupled to the first-side track of a first one of the second IDTs disposed between the first one of the first IDTs and the second one of the first IDTs. The method further includes forming a first overlap location wherein the second interconnect overlaps the first interconnect coupled to the first-side track of the first one of the first IDTs, forming a second overlap location wherein the second interconnect overlaps the first interconnect coupled to the first-side track of the second one of the first IDTs; and forming a first unified insulating element disposed between the first interconnect and the second interconnect in the first overlap location and the second overlap location.

In another aspect, an integrated circuit (IC) chip is disclosed. The IC includes a substrate, a piezoelectric layer disposed on the substrate, and a multi-mode surface acoustic wave (SAW) filter on the piezoelectric layer. The multi-mode SAW filter includes an interdigital transducer (IDT) row (IDT row) including first IDTs alternately disposed with second IDTs., each IDT of the IDT row including a first-side track on a first side of the IDT row and a second-side track on a second side of the IDT row opposite to the first side in a second direction orthogonal to the first direction; a first interconnect extending in the first direction on the first side of the IDT row and electrically coupled to first-side tracks of a first one of the first IDTs and a second one of the first IDTs, and a second interconnect extending in the first direction on the first side of the IDT row and coupled to a first-side track of a first one of the second IDTs disposed between the first one of the first IDTs and the second one of the first IDTs in the first direction. The multi-mode SAW filter further includes a first overlap location wherein the second interconnect overlaps in a third direction orthogonal to the first direction and the second direction, the first interconnect coupled to the first-side track of the first one of the first IDTs, a second overlap location wherein the second interconnect overlaps the first interconnect coupled to the first-side track of the second one of the first IDTs; and a first unified insulating element disposed between the first interconnect and the second interconnect in the first overlap location and the second overlap location.

DETAILED DESCRIPTION

Figure 1:
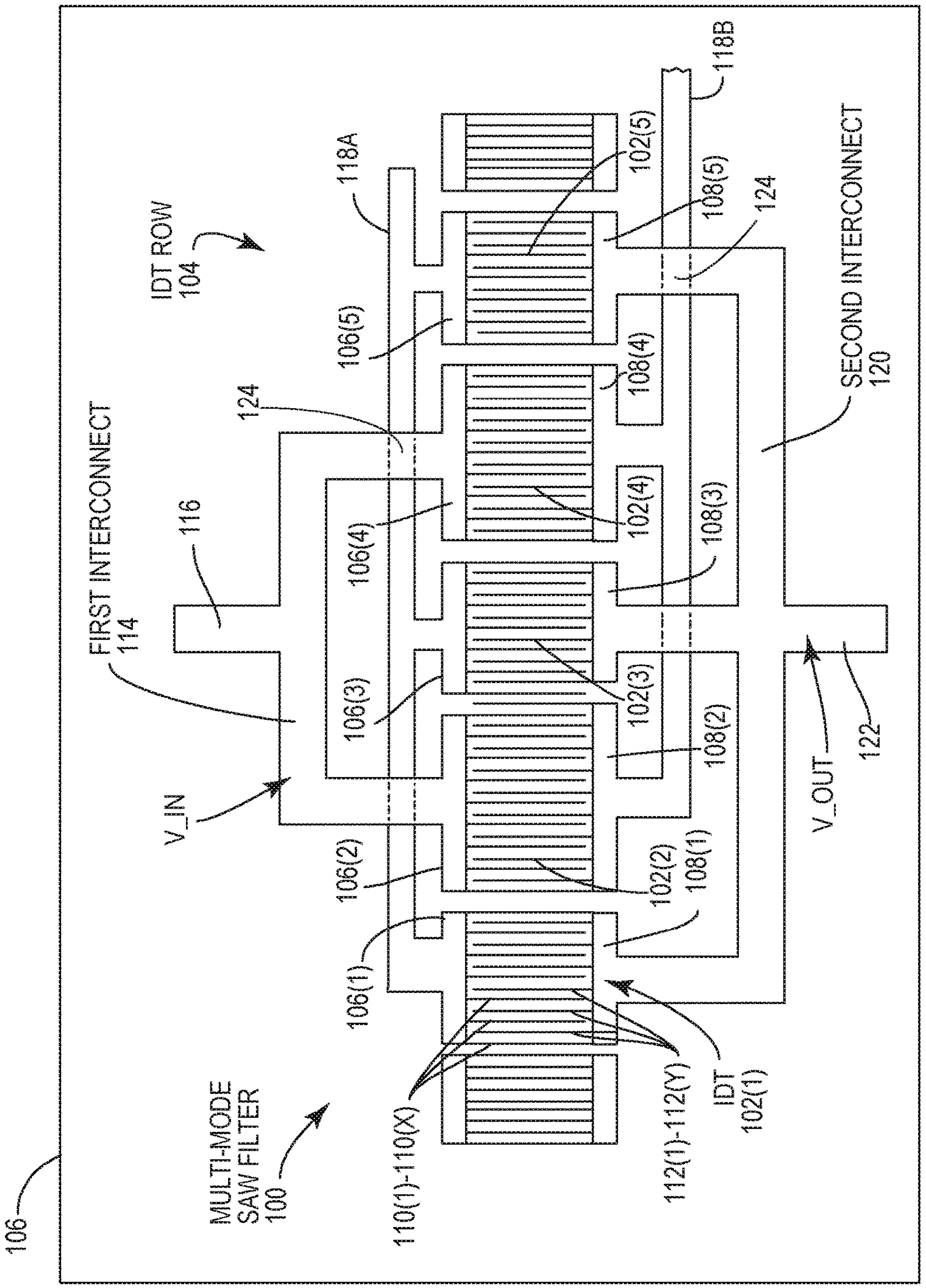
FIG. 1 RELATED ART
FIG. 1 is a schematic diagram of a multi-mode surface acoustic wave (SAW) filter, including interdigital transducers (IDTs) coupled to an input voltage and other IDTs coupled to an output voltage, to illustrate the necessity of insulating elements between respective interconnects.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-mode surface acoustic wave (SAW) filters with multi-track, unified insulating elements. Related methods of manufacturing a multi-mode SAW filter with unified insulating elements are also disclosed. Multi-mode SAW filters may include multiple interdigital transducers (IDTs) disposed in an IDT row with a first track of each of the IDTs on a first side of the row and a second track of each IDT on a second side of the row. A first interconnect is coupled to the first tracks of a plurality of first IDTs of the IDT row and a second interconnect is coupled to first tracks of a plurality of second IDTs and the second IDTs may alternate with the first IDTs. Consequently, the first and second interconnects may overlap each other at multiple overlap locations along the first side of the IDT row. An exemplary multi-mode SAW filter disclosed herein includes a unified insulating element that extends over multiple tracks on the first side of the IDT row to insulate the first interconnect and second interconnect from each other at multiple overlap locations. Employing a unified insulating element extending over multiple overlap locations as opposed to a discrete insulating element formed at each of the overlap locations avoids the manufacturing reliability problems of discrete insulating elements. In some examples, a second unified insulating element is disposed between the second interconnect and a third interconnect on a second side of the IDT row.

Multi-mode surface acoustic wave (SAW) filters include multiple interdigital transducers (IDTs) that are disposed in a row on a surface of a piezoelectric layer but are coupled to different voltage terminals. FIG. 1 is a schematic diagram of one example of a multi-mode (e.g., dual-mode) SAW filter 100, including IDTs 102(1)-102(5) disposed in an IDT row 104 on a substrate 106. The evenly numbered IDTs 102(2) and 102(4) are coupled to a different combination of external terminals than the oddly numbered IDTs 102(1), 102(3), and 102(5), which is indicative of a multi-mode (dual-mode in this example) SAW filter. Each of the IDTs 102(1)-102(5) includes first-side tracks 106(1)-106(5) and second-side tracks 108(1)-108(5) on opposite sides of the IDT row 104.

Referring to IDT 102(1), for example, a first-side track 106(1) comprises a plurality of first fingers 110(1)-110(X) and a second-side track 108(1) comprises a plurality of second fingers 112(1)-112(Y), with the first fingers 110(1)-110(X) and the second fingers 112(1)-112(Y) arranged in an alternating sequence and overlapping in the second, Y-axis direction, as shown.

In this example, a first interconnect 114 couples the first-side tracks 106(2), 106(4) of the evenly numbered IDTs 102(2), 102(4) to a first input terminal 116 to receive an input voltage V_IN. The second-side tracks 108(2), 108(4) of the evenly numbered IDTs 102(2), 102(4) are coupled to an interconnect 118B, which may be coupled to a reference voltage GND. The second-side tracks 108(1), 108(3), 108(5) of the oddly numbered IDTs 102(1), 102(3), 102(5) are each coupled to an interconnect 120 that is coupled to an output terminal 122 on which an output voltage V_OUT is generated, with the first-side tracks 106(1), 106(3), 106(5) coupled to an interconnect 118A. This example assumes the interconnect 118A coupled to the first-side tracks 106(1), 106(3), 106(5) and the interconnect 118B coupled to the second-side tracks 108(2) and 108(4) are both coupled to the reference voltage GND.

In an alternative example, the first-side tracks 106(2), 106(4) of the evenly numbered IDTs 102(2), 102(4) may be coupled to the first input terminal 116 to receive an input voltage V_IN and the first-side tracks 106(1), 106(3), 106(5) may be coupled to the output voltage V_OUT on the interconnect 118A. In this example, the second-side tracks 108(1), 108(3), and 108(5) are coupled to the reference voltage GND on the terminal 122 and the second-side tracks 108(2) and 108(4) are coupled to the reference voltage GND on the interconnect 118B. In such example, the interconnect 118B and the interconnect 120 may be coupled to each other and to the terminal 122.

In the first example described above, the interconnects 118A and 118B are coupled to different voltages (e.g., ground) than the first and second interconnects 114 and 120 and, due to their respective routing on the substrate 106, the interconnects 114 and 120 overlap (vertically above or below in a third, Z-axis direction) the interconnects 118A, 118B. In each overlap location 124, where the interconnects 114 and 120 overlap the interconnects 118A, 118B, discrete insulating elements are provided to prevent short circuits. However, these small discrete insulating elements formed in all the overlap locations 124 of a multi-mode SAW filter 100 can be unreliable, which can reduce manufacturing yield.

Figure 2A:
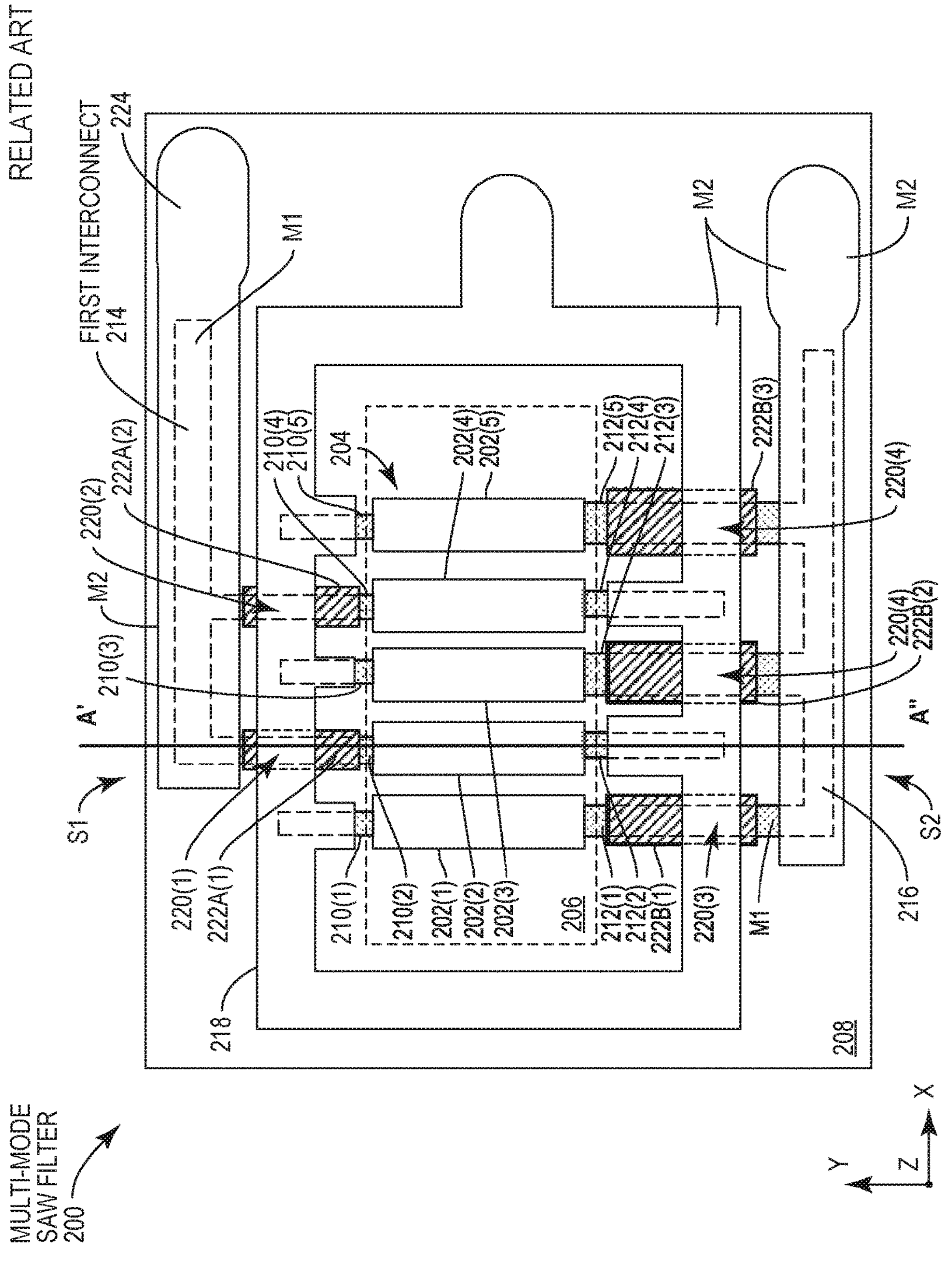
FIG. 2A is a top-down view illustrating interconnects coupled to IDTs in an example multi-mode SAW filter, as shown in FIG. 1, including discrete insulating elements disposed at overlap locations of interconnects having different voltages.

FIG. 2A is an illustration of a top-down view of a multi-mode SAW filter 200 of the type shown in FIG. 1, including interdigital transducers (IDTs) 202(1)-202(5) disposed in an IDT row 204 on a piezoelectric layer 206 on a substrate 208. First-side tracks 210(1)-210(5) of the IDTs 202(1)-202(5) are disposed on a first side S1 of the IDT row 204 and second-side tracks 212(1)-212(5) of the IDTs 202 (1)-202(5) are disposed on a second side S2 of the IDT row 204. The multi-mode SAW filter 200 includes a first interconnect 214 coupled to first-side tracks 210(2) and 210(4) and a second interconnect 216 coupled to second-side tracks 212(1), 212(3), and 212(5). A third interconnect 218 is coupled to the first-side tracks 210(1), 210(3), and 210(5) and to the second-side tracks 212(2) and 212(4). In the example in FIG. 2A, the first and second interconnects 214, 216 may be formed in a first metal layer M1 on the substrate 208. The third interconnect 218 is formed after the first and second interconnects 214, 216, in a second metal layer M2 on the substrate 208.

Locations at which the third interconnect 218 overlaps the first interconnect 214 and the second interconnect 216 are referred to herein as overlap locations 220(1)-220(5). To prevent an electrical connection between the first interconnect 214 and the third interconnect 218, the multi-mode SAW filter 200 includes discrete insulating elements 222A (1) and 222A(2) disposed on the first side S1 between the first interconnect 214, and the third interconnect 218 at the overlap locations 220(1) and 220(2). To prevent an electrical connection between the second interconnect 216 and the third interconnect 218, the multi-mode SAW filter 200 includes discrete insulating elements 222B(1)-222B(3) on the second side S2 between the second interconnect 216 and the third interconnect 218 at the overlap locations 220(3)-220(5). The multi-mode SAW filter 200 also includes an input interconnect 224 and an output interconnect 226, which may be formed in the second metal layer M2 on the first interconnect 214 and the second interconnect 216, respectively, to provide larger contact areas for connecting to other circuits (not shown) on the substrate 208 or to circuits external to the substrate 208.

Figure 2B:
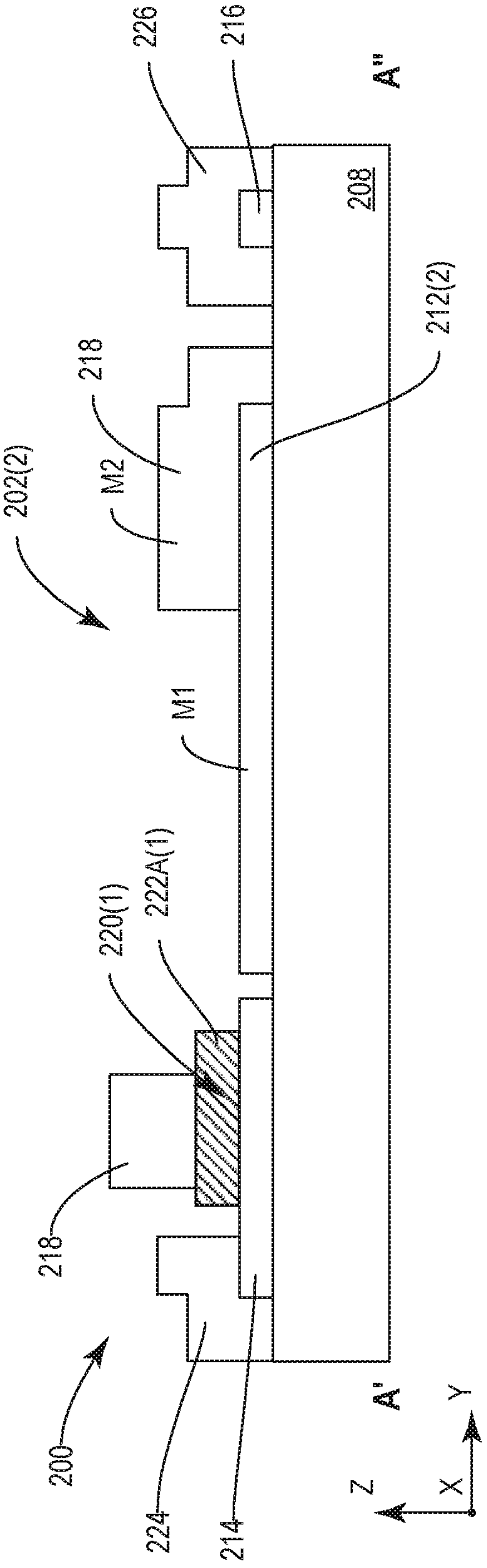
FIG. 2B is a cross-sectional side view of cross-section A'-A" of the multi-mode SAW filter in FIG. 2A to show the discrete insulating elements disposed at overlap locations of the interconnects.

FIG. 2B is a cross-sectional side view of cross-section A'-A" of the multi-mode SAW filter 200 in FIG. 2A, including the IDT 202(2) on the substrate 208, with the third interconnect 218 disposed on the second-side track 212(2). FIG. 2B is provided to show the discrete insulating element 222A(1) disposed at the overlap location 220(1) between the first interconnect 214 and the third interconnect 218. The input interconnect 224 is disposed on the first interconnect 214 on the first side (A') of the IDT row 204, and the output interconnect 226 is disposed on the second interconnect 216 on the second side (A") of the IDT row 204.

The insulating element 222A(1) may be deposited or formed by a subtractive process, for example, after formation of the first interconnect 214 in the first metal layer M1 and before formation of the third interconnect 218 in the second metal layer M2. The insulating element 222A(1) may be as wide, in the X-axis direction, as the first interconnect 214 and as long, in the Y-axis direction, as the third interconnect 218. Forming discrete insulating elements, such as the insulating elements 222A(1)-222A(2) and 222B (1)-222B(3) (see FIG. 2A), requires a higher level of precision and is, therefore, more difficult than forming larger features, such as the first, second, and third interconnects 214, 216, and 218. Defects in discrete insulating elements due to improper formation can cause short circuits between interconnects coupled to different voltages, resulting in catastrophic defects in multi-mode SAW devices, which reduce manufacturing yield.

Figure 3A:
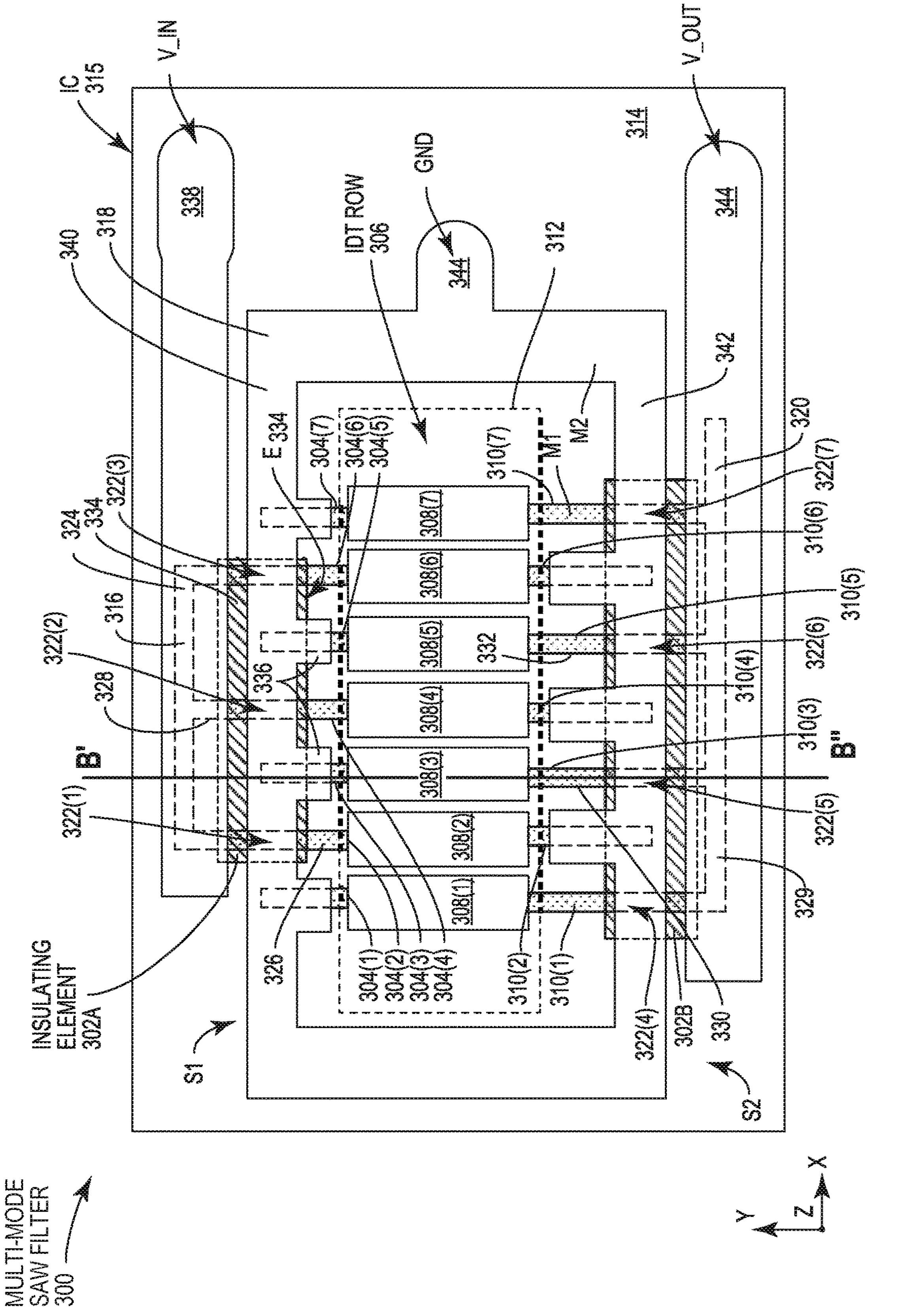
FIG. 3A is a top-down view illustrating a multi-mode SAW filter, as shown in FIG. 1, on an integrated circuit and including interconnects coupled to IDTs insulated from each other by unified, multi-track insulating elements.

FIG. 3A is a top-down view illustrating an exemplary multi-mode SAW filter 300 that is also the type shown in FIG. 1, but instead of employing discrete insulating elements at each overlap location, the multi-mode SAW filter includes a unified, multi-track insulating element 302A (unified insulating element 302A) disposed on first-side tracks 304(1)-304(7) on a first side S1 of an IDT row 306 of IDTs 308(1)-308(X) (where X=7 in this example) and unified insulating element 302B disposed on second-side tracks 310(1)-310(7) on a second side S2 of the IDT row 306. The multi-mode SAW filter 300 in FIG. 3A includes a piezoelectric layer 312 disposed on a substrate 314 of an integrated circuit (IC) 315 and the IDTs 308(1)-308(7) disposed in the IDT row 306 extending in the X-axis direction on the piezoelectric layer 312. On the first side S1 of the IDT row 306, a first interconnect 316 is coupled to the first-side tracks 304(2), 304(4), and 304(6), and a second interconnect 318 is coupled to the first-side tracks 304(1), 304(3), 304(5), and 304(7). The second interconnect 318 is disposed on the unified insulating element 302A on the first side S1 of the IDT row 306 and on the unified insulating element 302B on the second side S2. On the second side S2, the multi-mode SAW filter 300 includes a third interconnect 320 extending in the first (X-axis) direction and coupled to the second-side tracks 310(1), 310(3), 310(5), and 310(7) and the second interconnect 318 couples to the second-side tracks 310(2), 310(4), and 310(6). The second interconnect 318 is disposed on all of the first-side tracks 304(1)-304(7) on the first side S1 of the IDT row 306 but only coupled to the first-side tracks 304(1), 304(3), 304(5), and 304(7). Thus, there are overlap locations 322(1)-322(3) at which the second interconnect 318 crosses over (e.g., overlaps) but should be electrically insulated from the first interconnect 316 at the first-side tracks 304(2), 304(4), and 304(6) on the first side S1. The second interconnect 318 is also disposed on all of the second-side tracks 310(1)-310(7) on the second side S2 where it couples to the second-side tracks 310(2), 310(4), and 310(6), which creates overlap locations 322(4)-322(7) at which the second interconnect 318 crosses over the third interconnect 320 at the second-side tracks 310(1), 310(3), 310(5), and 310(7) on the second side S2.

Insulating the second interconnect 318 from the first interconnect 316 at overlap locations 322(1)-322(3) with the unified insulating element 302A and insulating the third interconnect 320 from the second interconnect 318 at overlap locations 322(4)-322(7) with the unified insulating element 302B (or more overlap locations if there are more IDTs in the IDT row 306) improves manufacturing yield compared to using discrete insulating elements at each of the overlap locations 322(1)-322(7) because the unified insulating elements 302A, 302B are significantly larger and can be manufactured with greater reliability than much smaller discrete insulating elements (as shown in FIG. 2A) using current manufacturing processes. Because the unified insulating element 302A is disposed between the second interconnect 318 and the first-side tracks 304(1), 304(3), 304(5), and 304(7), and the unified insulating element 302A is wider in the second, Y-axis direction than the second interconnect 318, but the second interconnect 318 needs to be electrically coupled to the first-side tracks 304(1), 304(3), 304(5), and 304(7), the second interconnect 318 includes regions 336 that extend in the second direction outside of the first unified insulating element 302A (e.g., in the Y-axis direction) to couple to the first-side tracks 304(1), 304(3), 304(5), 304(7). In more detail, the first unified insulating element 302A includes a first insulating layer 334 disposed on the first interconnect 316 and has a linear edge $E_{334}$ facing the IDT row 306 in the second direction and extending in the first direction. The regions 336 extend beyond, in the second direction, the linear edge $E_{334}$ of the first insulating layer 334 to couple to the first-side tracks 304(1), 304(3), 304(5), 304(7).

With continued reference to FIG. 3A, the multi-mode SAW filter 300 includes odd IDTs 308(1), 308(3), and 308(5) alternating with even IDTs 308(2), 308(4) extending in the X-axis direction in the IDT row 306. The first interconnect 316 includes a first segment 324 extending in the first (X-axis) direction on the first side S1 of the IDT row 306 and electrically coupled to the first-side tracks 304(2), 304(4) of the even IDTs 308(2), 308(4), wherein the first-side tracks 304(1)-304(5) of the plurality of IDTs 308(1)-308(5) extend in a second (Y-axis) direction orthogonal to the first (X-axis) direction from the first side S1 of the IDT row 306. The second interconnect 318 includes a segment 340 that extends in the first direction on the first side S1 of the IDT row 306 and is coupled to the first-side tracks 304(1), 304(3), 304(5) of at least one odd IDT 308(1), 308(3), 308(5) in the IDT row 306. The first unified insulating element 302A is disposed between the first interconnect 316 and the second interconnect 318 in the third (Z-axis) direction, which is orthogonal to the first (X-axis) direction and the second (Y-axis) direction. The first unified insulating element 302A extends in the first direction from a first even IDT 308(2) to at least a second even IDT 308(4).

The first interconnect 316 includes at least a second segment 326 extending from the first segment 324 in the second (Y-axis) direction. The second segment 326 is coupled to the first-side track 304(2) of the first even IDT 308(2) in the IDT row The second interconnect 318 is coupled to the first-side track 304(3) of the odd IDT 308(3), which is disposed between the first even IDT 308(2) and the second even IDT 308(4) in the IDT row 306. The first unified insulating element 302A extends in the first direction between the first overlap location 322(1), at which the second interconnect 318 overlaps the second segment 326 of the first interconnect 316, and a second overlap location 322(2), at which the second interconnect 318 overlaps a third segment 328 of the first interconnect 316. It should be understood that, in the context herein, the expression "A overlaps B" may indicate that A is above B in the Z-axis direction or that A is below B in the Z-axis direction.

The third interconnect 320 includes a fifth segment 329 that extends in the first direction on the second side S2 of the IDT row 306. The third interconnect 320 also includes a segment 330 and a segment 332 that each extends in the second direction from the fifth segment 329 and couples to the second-side tracks 310(3) and 310(5) of the odd IDTs 308(3) and 308(5), respectively, in the IDT row 306. On the second side S2 of the IDT row 306, the second interconnect 318 includes a segment 342 that extends in the first direction and couples to a second-side track 310(2) of the first even IDT 308(2) and the second-side track 310(4) of the second even IDT 308(4), which is between the odd IDT 308(3) and the odd IDT 308(5) in the IDT row 306. The second unified insulating element 302B is between the third interconnect 320 and the second interconnect 318 in the third, Z-axis direction and extends in the first direction between the overlap location 322(3), in which the second interconnect 318 overlaps the segment 330, and the overlap location 322(5), in which the second interconnect 318 overlaps the segment 332.

The second interconnect 318 and the first segment 324 of the first interconnect 316 each extend in the first, X-axis direction (e.g., parallel to each other). In some examples, the second interconnect 318 is between the first segment 324 and the first side S1 of the IDT row 306 in the second, Y-axis direction. In some examples, the second interconnect 318 is disposed directly on the first segment 324 of the first interconnect 316. That is, the second interconnect 318 may be disposed above or below the first segment 324 of the first interconnect 316. In either configuration, the first unified insulating element 302A is disposed between the second interconnect 318 and the segments 326, 328 of the first interconnect 316.

In the multi-mode SAW filter 300, the first interconnect 316 and the third interconnect 320 may both be formed in a first metal layer M1 on the piezo substrate 314 and the second interconnect 318 may be formed in a second metal layer M2 on the substrate 314. The second metal layer M2 may be disposed on the substrate 314 after the first metal layer M1 is disposed on the substrate 314. The second interconnect 318 in the multi-mode SAW filter 300 may be coupled to a reference voltage such as a ground voltage GND. The first interconnect 316 may be coupled to an input interconnect 338 configured to receive an input signal V_IN and the third interconnect 320 may be coupled to an output interconnect 344 configured to generate an output signal V_OUT.

Figure 3B:
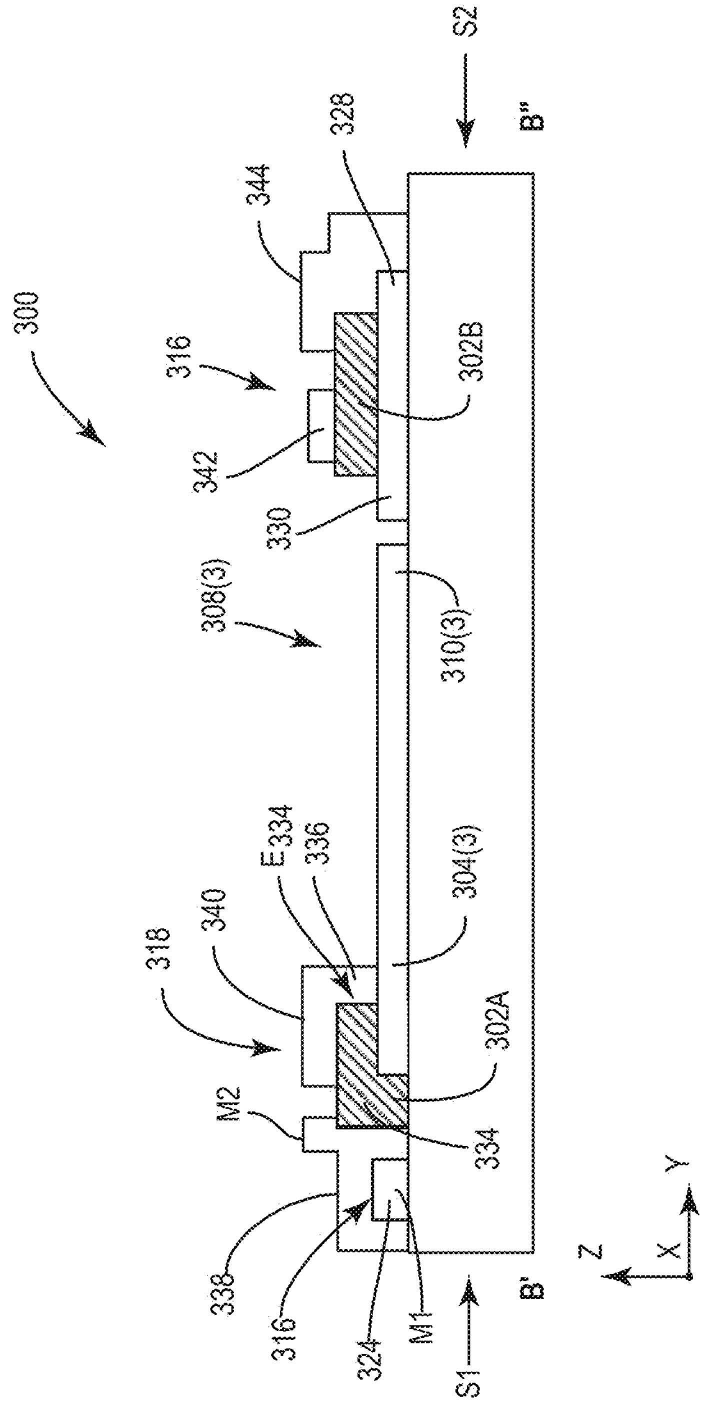
FIG. 3B is a cross-sectional side view of cross-section B'-B" of the multi-mode SAW filter in FIG. 3A to show the unified, multi-track insulating elements on the first-side tracks and the second-side tracks of the IDTs.

FIG. 3B is a cross-sectional side view of cross-section B'-B" of the multi-mode SAW filter 300 in FIG. 3A showing the unified insulating elements 302A on the first-side tracks 304(3) and the unified insulating element 302B on one of the second-side tracks 310(3) of one of the IDTs 308(3). On the first side S1 (C'), the input interconnect 338 is disposed on the first segment 324 of the first interconnect 316. The unified insulating element 302A is disposed on the first-side track 304(3) of the odd IDT 308(3) and the segment 340 of the second interconnect 318 is disposed on the unified insulating element 302A. Here, the second interconnect 318 also includes one of the regions 336 extending beyond the linear edge $E_{334}$ of the first insulating layer 334 of the unified insulating element 302A in the second, Y-axis direction (and the Z-axis direction) to couple to the first-side track 304(3). On the second side S2 (C"), the output interconnect 344 is disposed on the segment 328. The second unified insulating element 302B is disposed on the segment 330 of the third interconnect 320 that extends in the second, Y-axis direction (e.g., toward the first side S1) from the segment 328. The segment 342 of the second interconnect 318 is disposed on the second unified insulating element 302B and, thereby, insulated from the segment 330.

Figure 4:
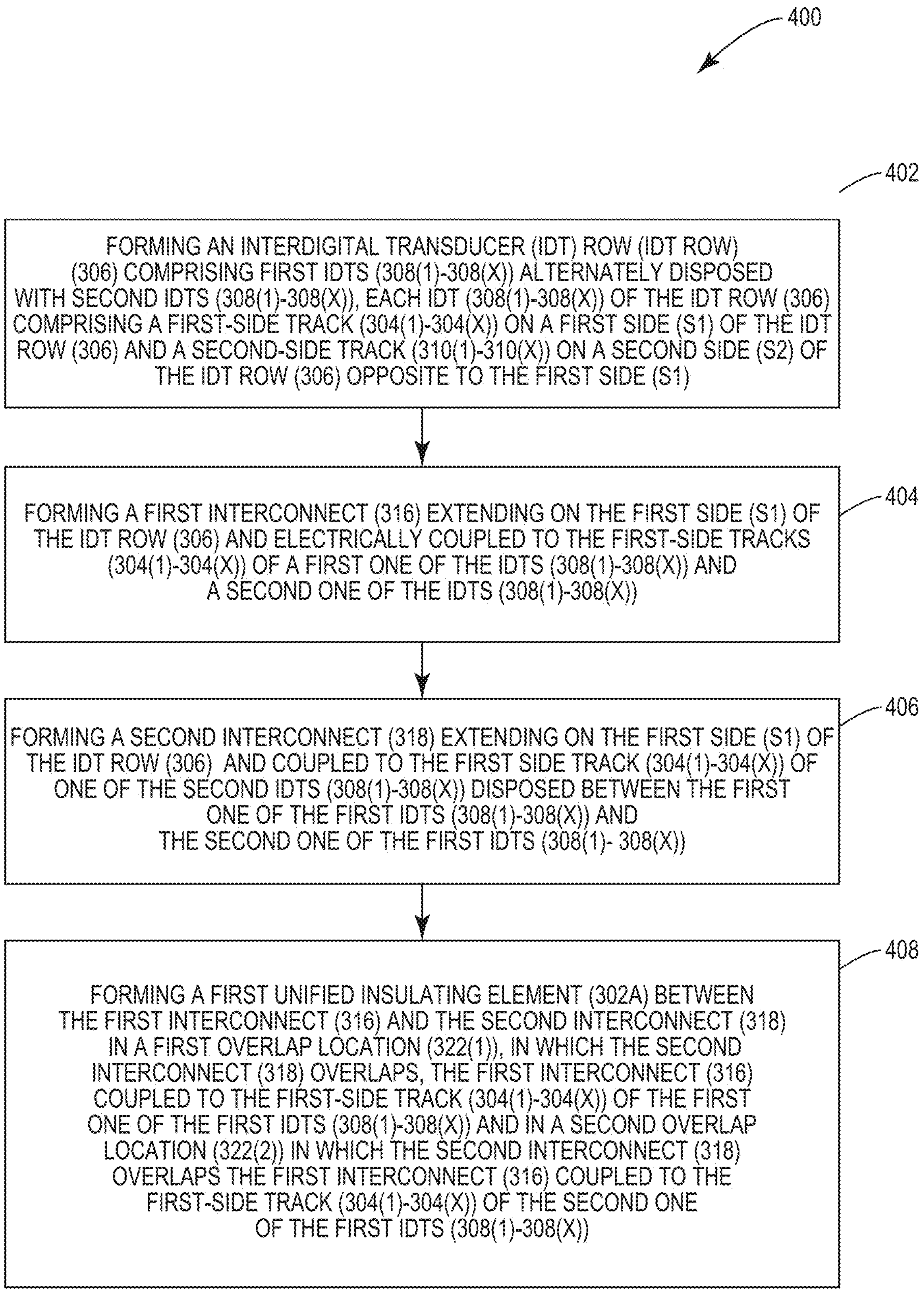
FIG. 4 is a flowchart of an exemplary process for manufacturing the multi-mode SAW filter of FIG. 1.

FIG. 4 is a flowchart of an exemplary process 400 for manufacturing a multi-mode SAW filter, such as the multi-mode SAW filter 300 in FIG. 3A. The process includes forming a plurality of IDTs 308(1)-308(X) comprising even IDTs 308(2), 308(4), 308(6) alternating with odd IDTs 308(1), 308(3), 308(5), 308(7) in an IDT row 306 extending in a first (X-axis) direction (block 402) and forming a first interconnect 316 comprising a first segment 324 extending in the first (X-axis) direction on a first side S1 of the IDT row 306 and electrically coupled to the even IDTs 308(2), 308(4), 308(6) on the first side S1 of the IDT row 306 (block 404). The process 400 further includes forming a second interconnect 318 extending in the first (X-axis) direction on the first side S1 of the IDT row 306 and coupled to the odd IDTs 308(1), 308(3), 308(5), 308(7) on the first side S1 of the IDT row 306 (block 406); and forming a first unified insulating element 302A between the first interconnect 316 and the second interconnect 318 in a third (Z-axis) direction orthogonal to the first (X-axis) direction and the second (Y-axis) direction and extending in the first (X-axis) direction from a first even IDT 308(2) to at least a second even IDT 308(4) (block 408).

FIG. 5 is a top-down view illustrating a multi-mode SAW filter 500 of the type shown in FIG. 3A, including unified, multi-track insulating elements 502A and 502B disposed between interconnects compactly arranged on sides S1 and S2, respectively, of an IDT row 504. The IDT row 504 includes IDTs 506(1)-506(7), including odd IDTs 506(1), 506(3), 506(5), and 506(7) and even IDTs 506(2), 506(4), and 506(6). The IDT row 504 includes first-side tracks 508(1)-508(7) on a first side S1 and second-side tracks 510(1)-510(7) on a second side S2 (510(2)-510(6) not labeled). In this example, a first interconnect 512 includes a first segment 514A coupled to the first-side tracks 508(1), 508(3), 508(5), and 508(7) of the odd IDTs 506(1), 506(3), 506(5), and 506(7) and a second segment 514B coupled to the second-side tracks 510(2), 510(4), 510(6) of the even IDTs 506(2), 506(4), 506(6). A second interconnect 516 couples to the first-side tracks 508(2), 508(4), 508(6) of the even IDTs 506(2), 506(4), 506(6) and the third interconnect 518 is coupled to the second-side tracks 510(1), 510(3), 510(5), 510(7) of the odd IDTs 506(1), 506(3), 506(5), and 506(7). The interconnects 514A and 514B may be coupled to the reference voltage GND. The second interconnect 516 is disposed above (e.g., directly above) the first segment 514A on the first side S1 and a third interconnect 518 is disposed above the second segment 514B of the first interconnect 512 on the second side S2. The unified insulating element 502A is disposed between the second interconnect 516 and the first segment 514A of the first interconnect 512. The unified insulating element 502B is disposed between the third interconnect 518 and the second segment 514B of the first interconnect 512. The unified insulating element 502A may be formed of an insulation layer 520 having a linear edge $E_{520}$ and the second interconnect 516 is coupled to the first-side tracks 508(2), 508(4), 508(6) by regions 522(1)-522(3).

The multi-mode SAW filter 500 includes overlap locations 524(1)-524(4) on the first side S1, where the second interconnect 516 overlaps the first segment 514A of the first interconnect 512 and overlap locations 524(5)-524(7) on the second side S2, where the third interconnect 518 overlaps the second segment 514B of the first interconnect 512. The unified insulating element 502A extends across the overlap locations 524(1)-524(4) in the first direction, and the unified insulating element 502B extends across the overlap locations 524(5)-524(7). As discussed above, employing larger, unified insulating elements 502A and 502B as opposed to small discrete insulating elements at each overlap location reduces manufacturing defects and increases yield.

Referring again to FIG. 5A, each of the IDTs 506(1)-506(7) is coupled to the reference voltage GND but the first-side tracks 508(2), 508(4), 508(6) of the even IDTs 506(2) 506(4), 506(6) couple to the reference voltage GND on the first side S1 and the second-side tracks 510(1), 510(3), 510(5), 510(7) of the odd IDTs 506(1), 506(3), 506(5), and 506(7) couple to the reference voltage GND on the second side S2. In that arrangement, an interconnect coupled to the reference voltage GND is needed on both sides S1 and S2 of the multi-mode SAW filter 500.

Figure 5A:
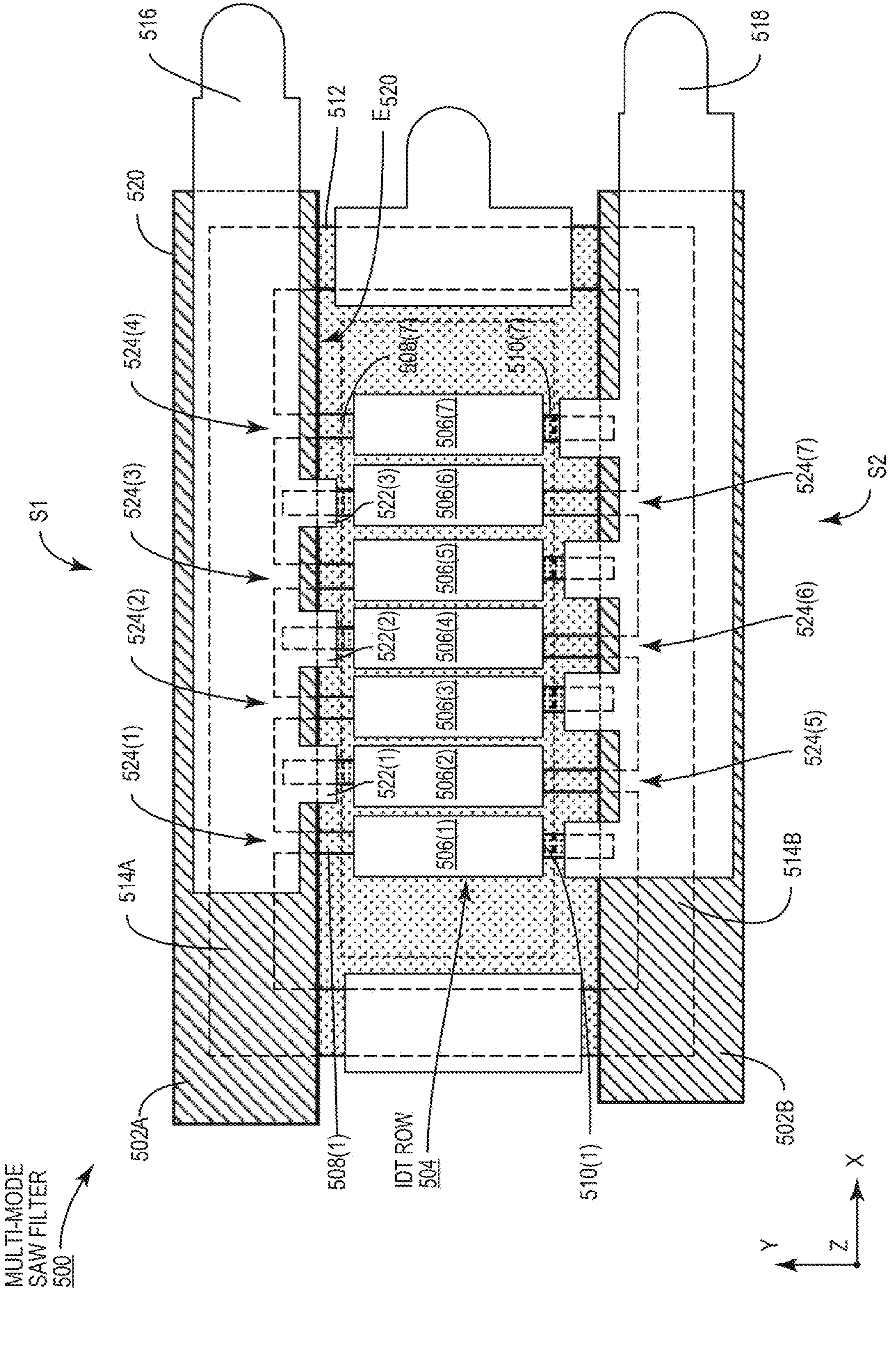
FIG. 5A is a top-down view illustrating a second example of a multi-mode SAW filter, as shown in FIG. 1, including unified, multi-track insulating elements disposed between compact interconnects coupled to the IDTs.
Figure 5B:
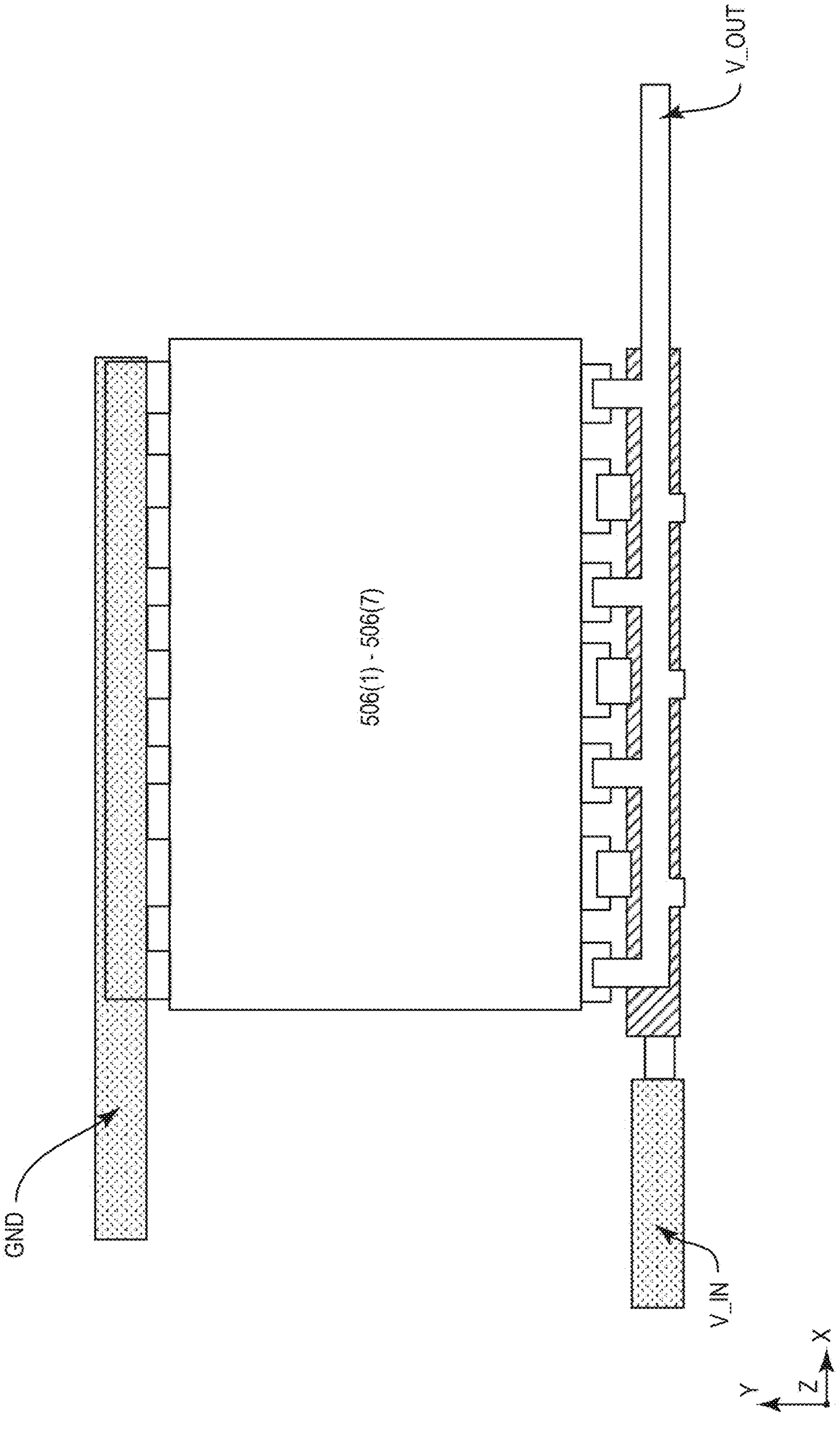
FIG. 5B is a top-down view illustrating the second example of a multi-mode SAW filter in FIG. 5A with an alternative interconnect arrangement requiring a single unified, multi-track insulating element.

FIG. 5B is a top-down view illustrating a more area efficient example of the multi-mode SAW filter 500 in FIG. 5A with an alternative interconnect arrangement that employs one unified, multi-track insulating element 502B instead of both elements 502A and 502B in FIG. 5A. In contrast to FIG. 5A, in the multi-mode SAW filter 500 in FIG. 5B, all the first-side tracks 508(1)-508(7) of the IDTs 506(1)-506(7) are coupled to the interconnect 514A, which may be coupled to the reference voltage GND. The input voltage V_IN and the output voltage V_OUT are alternately coupled to the second side tracks 510(1)-510(7). Accordingly, there are overlap locations 524(1)-524(7) and a short circuit may be avoided in all of such overlap locations 524(1)-524(7) using only the unified insulating element 502B.

Figure 6:
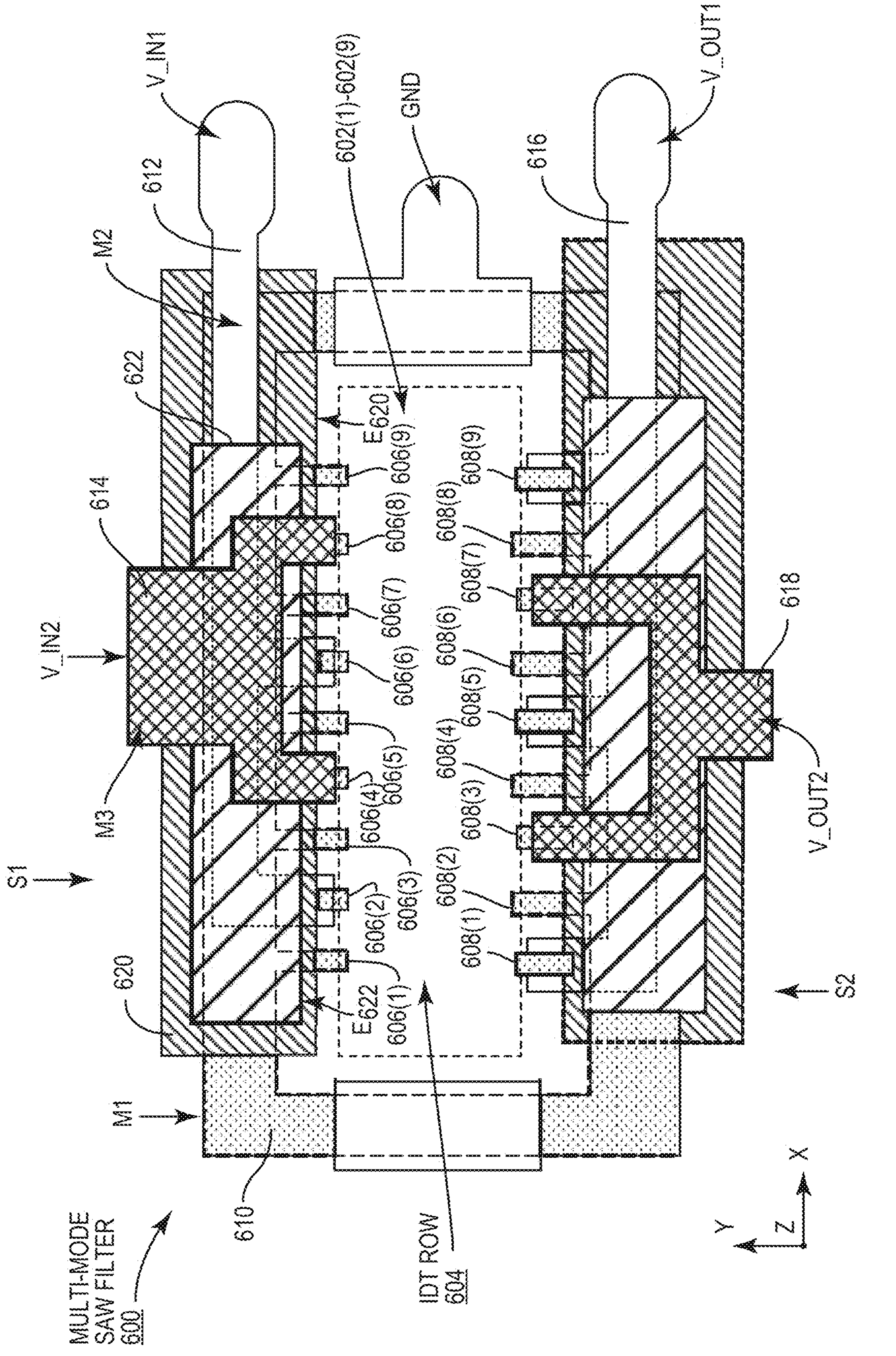
FIG. 6 is a top-down view illustrating a third example of a multi-mode SAW filter configured to couple to more signal voltages than in FIGS. 3A and 5 and including unified, multi-track insulating elements disposed at overlap locations between multiple levels of interconnects.

FIG. 6 is a top-down view illustrating a multi-mode SAW filter 600 having more distinct voltages than in the examples in FIGS. 3A, 3B, and 5, which includes unified, multi-track insulating elements disposed at overlap locations at multiple levels of interconnects. The multi-mode SAW filter 600 includes IDTs 602(1)-602(9) in an IDT row 604 extending in the first, X-axis direction with first-side tracks 606(1)-606(9) on the first side S1 of the IDT row 604 and second-side tracks 608(1)-608(9) on the second side S2 of the IDT row 604. In contrast to the even IDTs and odd IDTs in the multi-mode SAW filters 300 and 500 described above, in which the even IDTs were coupled to the input voltage V_IN and the reference voltage GND, and the odd IDTs were coupled to the reference voltage GND and the output voltage V_OUT, the first-side tracks 606(1)-606(9) in the multi-mode SAW filter 600 are coupled to several distinct combinations of input voltage V_IN1 and V_IN2, output voltages V_OUT1 and V_OUT2, and the reference voltage GND.

The multi-mode SAW filter 600 includes a first interconnect 610 providing the reference voltage GND to the odd first-side tracks 606(1), 606(3), 606(5), 606(7), and 606(9), and to the even second-side tracks 608(2), 608(4), 608(6), and 606(8). A second interconnect 612 is coupled to the first-side tracks 606(2) and 606(6) to provide the first input voltage V_IN1 and a third interconnect 614 is coupled to the first-side tracks 606(4) and 606(8) to provide the second input voltage V_IN2. A fourth interconnect 616 is coupled to the second-side tracks 608(1), 608(5), and 608(9) to generate the first output voltage V_OUT1, and a fifth interconnect 618 is coupled to the second-side tracks 608(3) and 608(7) to generate the second output voltage V_OUT2.

The first interconnect 610 may be formed in a first metal layer M1, for example, with the second interconnect 612 formed in a second metal layer M2 on the first side S1 of the IDT row 604, and the fourth interconnect 616 formed in the second metal layer M2 on the second side S2. In this example, the second interconnect 612 and the fourth interconnect 616 are directly on the first interconnect 610. Thus, the second interconnect 612 overlaps the first interconnect 610 from the first-side track 606(1) to the first-side track 606(9), and the fourth interconnect 616 overlaps the first interconnect 610 from the first-side track 606(1) to the first-side track 606(9).

In addition, the third interconnect 614 may be formed in a third metal layer M3 on the first side S1 of the IDT row 604 on the second interconnect 612, and the fifth interconnect 618 may be formed in the third metal layer M3 on the second side S2 of the IDT row 604 on the fourth interconnect 616. Thus, the third interconnect 614 overlaps the second interconnect 612 from the second-side track 608(4) to the second-side track 608(8). Similarly, the fifth interconnect 618 overlaps the fourth interconnect 616 from the second-side track 608(3) to the second-side track 608(7).

To insulate the respective interconnects from each other without employing discrete insulating elements at each overlap location, the multi-mode SAW filter 600 includes, on the first side S1, a first unified insulating element 620 disposed between the first interconnect 610 and the second interconnect 612, and a second unified insulating element 622 disposed between the second interconnect 612 and the third interconnect 614. Each of the first and second unified insulating elements 620, 622 extend in the first, X-axis direction and have respective linear edges $E_{620}$ and $E_{622}$. The multi-mode SAW filter 600 further includes, on the second side S2, a third unified insulating element 624 disposed between the first interconnect 610 and the fourth interconnect 616, and a fourth unified insulating element 626 disposed between the fourth interconnect 616 and the fifth interconnect 618. Each of the third and fourth unified insulating elements 624, 626 extend in the first, X-axis direction and have respective linear edges $E_{624}$ and $E_{626}$.

The second interconnect 612 includes regions 628(1) and 628(2) that extend in the second, Y-axis direction beyond the linear edge $E_{620}$ of the first unified insulating element 620 to couple to the first-side tracks 606(2) and 606(6). The third interconnect 614 includes regions 630(1) and 630(2) that extend in the second, Y-axis direction beyond the linear edge $E_{622}$ to couple to the first-side tracks 606(4) and 606(8). The fourth interconnect 616 includes regions 632(1)-632(3) that extend in the second, Y-axis direction beyond the linear edge $E_{624}$ to couple to the second-side tracks 608(1), 608(5), and 608(9). The fifth interconnect 618 includes regions 634(1) and 634(2) that extend in the second direction beyond the linear edge $E_{626}$ to couple to the second-side tracks 608(3) and 608(7).

Figure 7A:
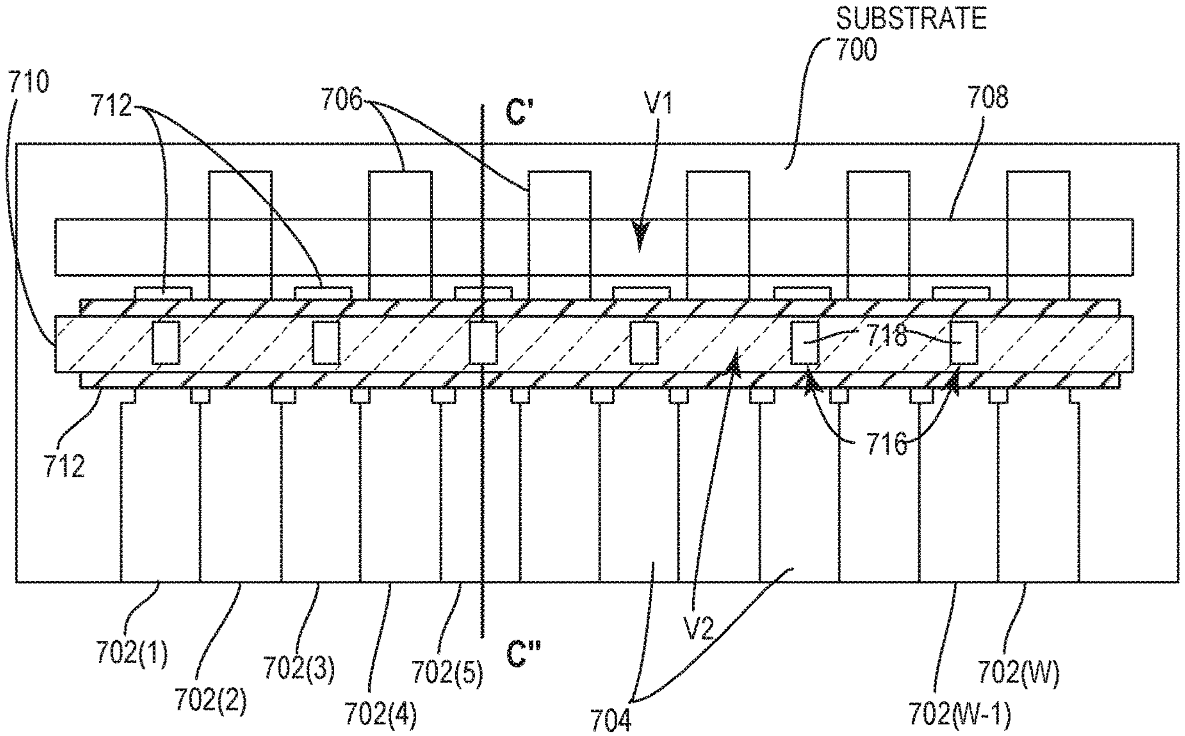
FIG. 7A is a top-down view of an example of tracks on a first side of an IDT row disposed on a substrate, with metal vias through a unified insulating element to couple the tracks to an interconnect.

FIG. 7A is a top-down view of a portion of a substrate 700 including metal tracks 702(1)-702(W), including first, odd tracks 704 (e.g., tracks 702(1), 702(3), . . . 702(W−1)) and second, even tracks 706 (e.g., tracks 702(2), 702(4), . . . 702(W)) disposed on a first side of an IDT row (not shown) of a multi-mode SAW filter. As shown in this example, the second, even tracks 706 extend farther in the second (Y-axis) direction than the first, odd tracks 704. A first interconnect 708 extends across and provides a first voltage V1 to the even tracks 706 and a second interconnect 710 provides a second voltage V2 to the odd tracks 704. The first interconnect 708 and the second interconnect 710 may be formed in the same metal layer after a unified insulating element 712 is previously formed on the tracks 702(1)-702(W). The unified insulating element 712 includes a first insulating layer 714 extending in the first, X-axis direction. The unified insulating element 712 includes openings 716 (e.g., holes or voids) extending through the first insulating layer 714 in the third, Z-axis direction on the odd tracks 704. In some examples, the openings 716 may be formed on some other pattern of tracks 706 that are to be provided the first voltage V1 when there is, for example, a third voltage V3 (not shown) to be provided to some of the tracks 702(1)-702(W).

When the first interconnect 708 is formed on the unified insulating element 712 by the deposition or accumulation of metal, the openings 716 may be filled to form a plurality of metal vias 718, connecting the first interconnect 708 to the odd tracks 704. The second interconnect 710 may be disposed on only the even tracks 706, which extend farther in the second (Y-axis) direction.

Figure 7B:
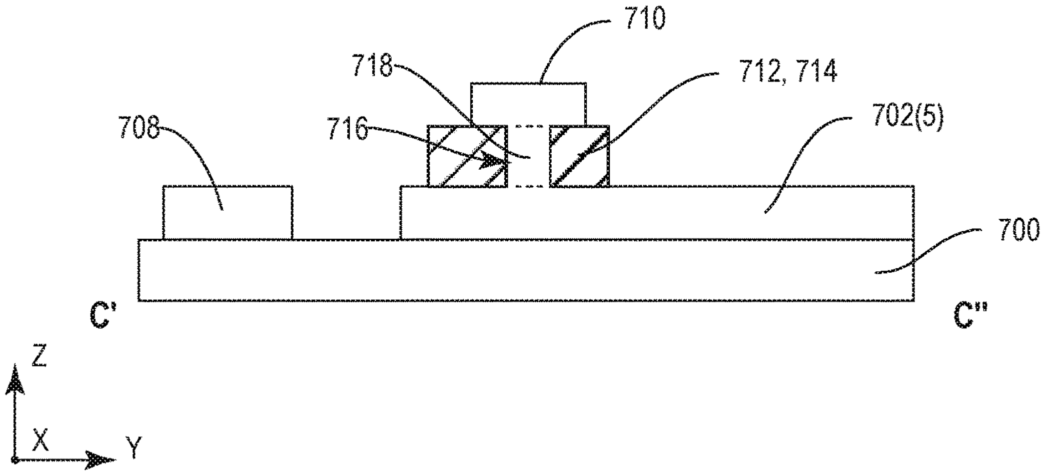
FIG. 7B is a side view of cross-section C'-C" of the example in FIG. 7A, showing a metal via extending through an opening in the unified insulating element.

FIG. 7B is a side view of the cross-section C'-C" through one of the metal vias 718 of the substrate 700 in FIG. 7A, showing a connection of the second interconnect 710 to one of the odd tracks 704 (e.g., 702(5)). The cross-section C'-C" extends longitudinally along the odd track 704 and across the first interconnect 708, which are both disposed on a substrate 700. This view also shows a cross-section of the unified insulating element 712, one of the openings 716, and the metal via 718 formed in the opening 716. The second interconnect 710 is disposed on top of the first insulating layer 714 and on the metal via 718, forming an electrical contact to the odd track 704 and reinforcing the adhesion between elements 702 and 710.

Figure 8:
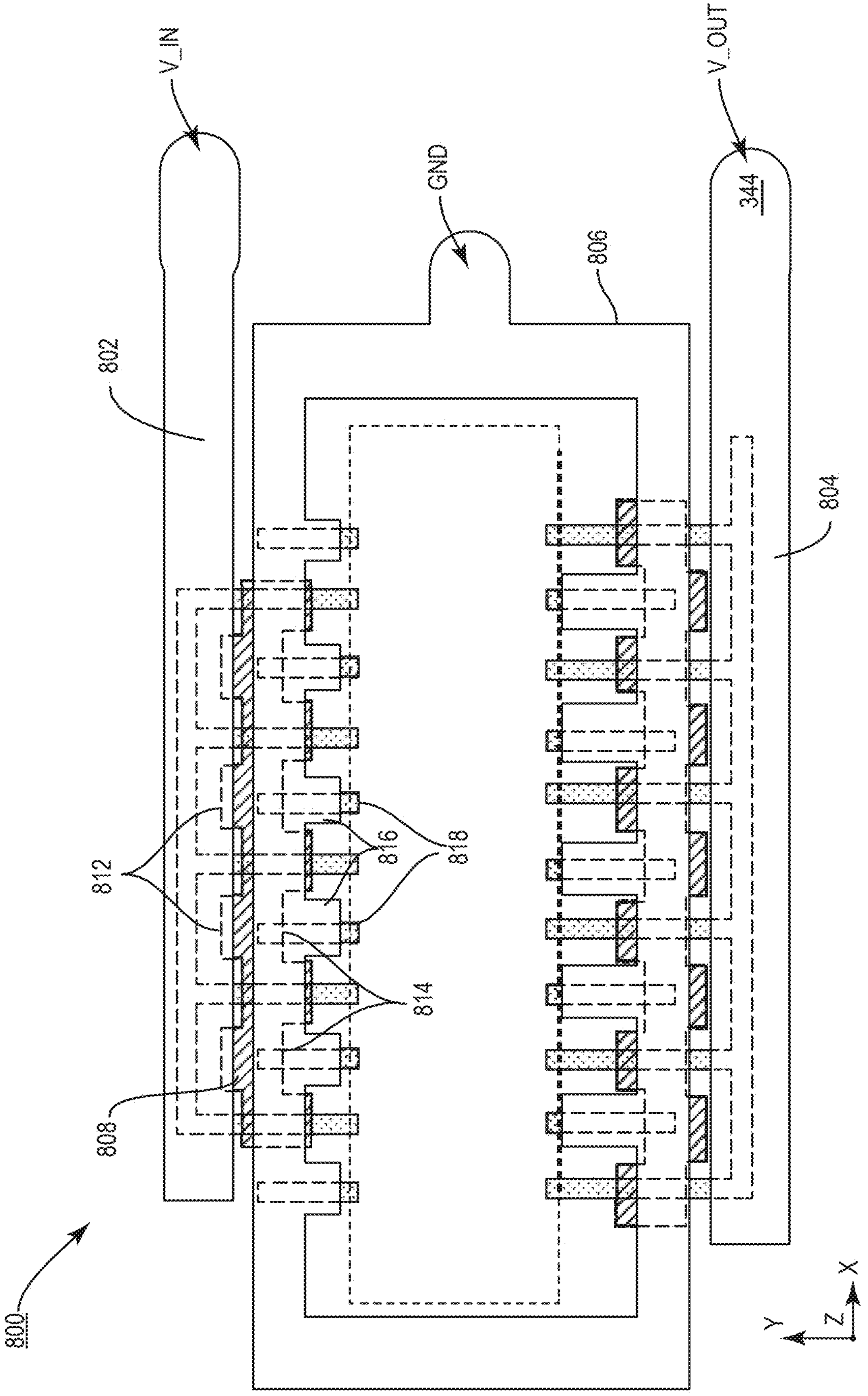
FIG. 8 is a top-down view of a multi-mode SAW filter in which the unified insulating elements include edge offsets on the tracks of an IDT between the interconnect overlap locations.

FIG. 8 is a top-down view of a multi-mode SAW filter 800, including a first interconnect 802 coupled to an input voltage V_IN on a first side S1, a second interconnect 804 coupled to an output voltage V_OUT, and a third interconnect 806 coupled to a reference voltage GND. The first interconnect 802 includes a first metal layer M1 portion that couples to the even tracks 822 and a second metal layer M2 portion for external contact. The second interconnect 804 also includes a first metal layer M1 portion and a second metal layer M2 portion. As shown, the third interconnect 806 is insulated from the first metal layer M1 portion of the first interconnect 802 by a unified insulating element 808 at multiple overlap locations 820 corresponding to the even tracks 822 of IDTs 824. The unified insulating element 808 extends longitudinally between the first interconnect 802 and the third interconnect 806 in a first, X-axis direction and laterally in a second, Y-axis direction. In the overlap locations 820 on the first side S1 of the multi-mode SAW filter 800 (e.g., on the even tracks 822), the unified insulating element 808 is wider in the second direction than the third interconnect 806 to prevent short circuits between the third interconnect 806 and the first interconnect 802.

In an exemplary aspect, the unified insulating element 808 includes outer edge offsets 812 and inner edge offsets 814 at locations where the third interconnect 806 couples to odd tracks 818 of the IDTs 824. On the odd tracks 818, between the overlap locations 820, the unified insulating element 808 includes the outer edge offsets 812 that extend far enough in the second direction that the second metal layer M2 portion of the first interconnect 802 overlaps the unified insulating layer 808. The shape of the unified insulating element 808 discussed to this point has been determined by the electrical insulating function it provides. However, the outer edge offsets 812 extend under the first interconnect 802 to improve adhesion of the unified insulating element 808 to the substrate 826 on which the multi-mode SAW filter 800 is disposed, to increase reliability.

The inner edge offsets 814 are opposite to the outer edge offsets 812, where the third interconnect 806 couples to the odd tracks 818. Rather than extending in the second direction to make the unified insulating element 808 wider than the third interconnect 806, the inner edge offsets 814 extend inward, in the same direction as the outer edge offsets 812 to increase a contact area of the third interconnect 806 and the odd tracks 818 (or the first metal layer M1 of the first interconnect 802). This additional contact area may increase strength of the physical connection of the odd tracks 818 and the second metal layer M2 of the third interconnect 806 and the increased area also has lower electrical resistance.

ICs, including multi-mode SAW filters in which multiple overlap locations of interconnects at different voltages are insulated from each other by a multi-track unified insulating element, may be employed in any processor-based device. Examples of such processor-based devices, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 9:
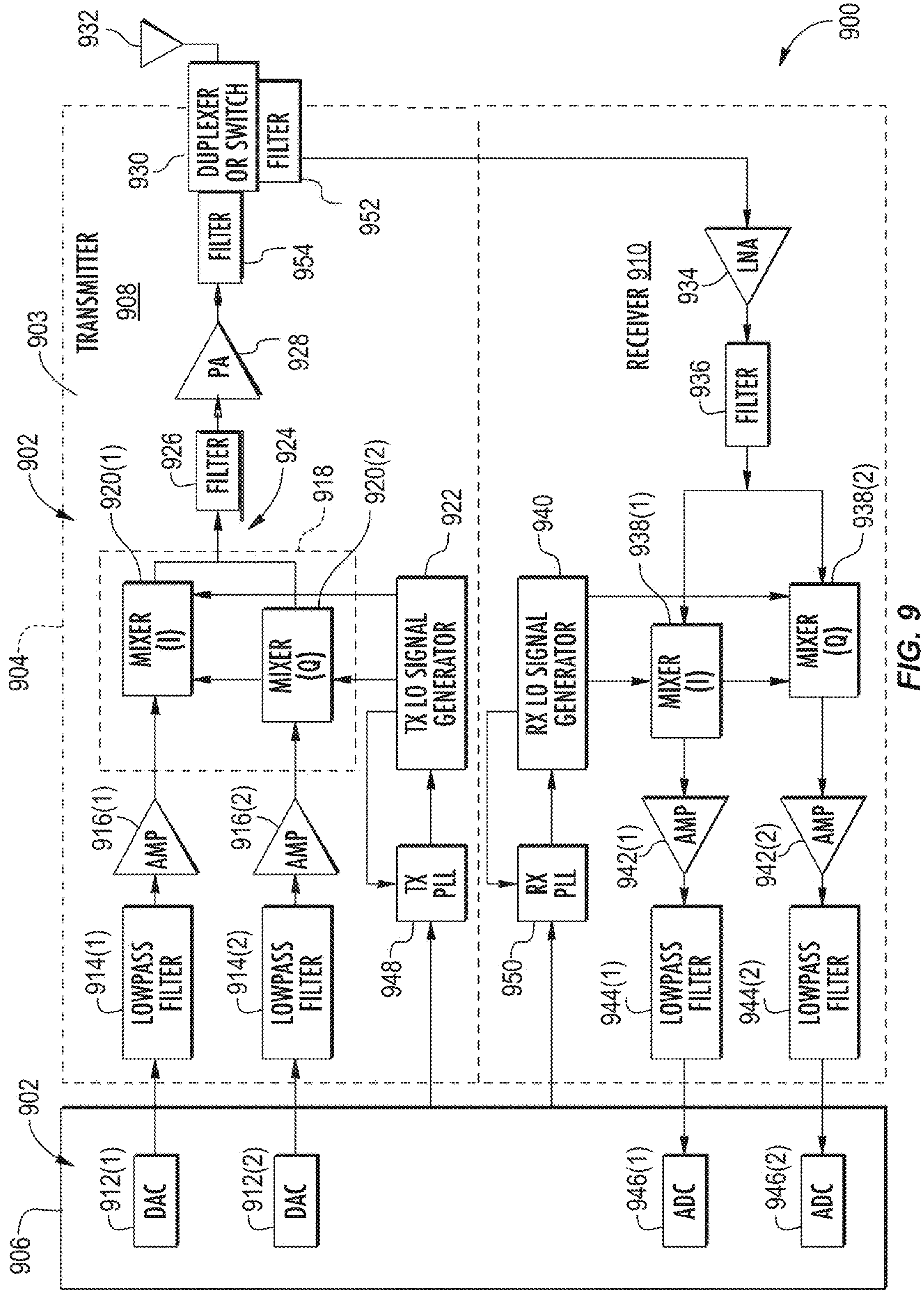
FIG. 9 is a block diagram of an exemplary IC that includes a multi-mode SAW filter, including unified insulating elements disposed between interconnects of different voltages.

FIG. 9 illustrates an exemplary wireless communications device 900 that includes radio-frequency (RF) components formed from one or more ICs 902, wherein any of the ICs 902 may include multi-mode SAW filters in which multiple overlap locations of interconnects at different voltages are insulated from each other by a multi-track unified insulating element, as shown in any of FIGS. 3A, 5, and 6. The wireless communications device 900 may include or be provided in any of the above-referenced devices as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals (e.g., I and Q output currents) for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency up-conversion as well as noise in a receive frequency band. A power amplifier (PA) 928 amplifies the upconverted signal 924 from the filter 926 to obtain the desired output power level and provides a transmit RF signal. The transmit RF signal is filtered by a transmit filter 954 before being routed through a duplexer or switch 930 and transmitted via an antenna 932. The transmit filter 954 may be a multi-mode SAW filter as disclosed herein and shown in any of FIGS. 3A, 3B, 5A, 5B, 6, and 8, and may be included in or separate from the duplexer or switch 930.

In the receive path, the antenna 932 receives signals transmitted by base stations and provides a received RF signal, which is routed through the duplexer or switch 930 and receiver filter 952 before being provided to a low noise amplifier (LNA) 934. The receive filter 952 may be a multi-mode SAW filter as disclosed herein and shown in any of FIGS. 3A, 3B, 5A, 5B, 6, and 8, and may be included in or separate from the duplexer or switch 930. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Down-conversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency up-conversion, while the RX LO signal generator 940 generates the I and Q RX LO signals used for frequency down-conversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Figure 10:
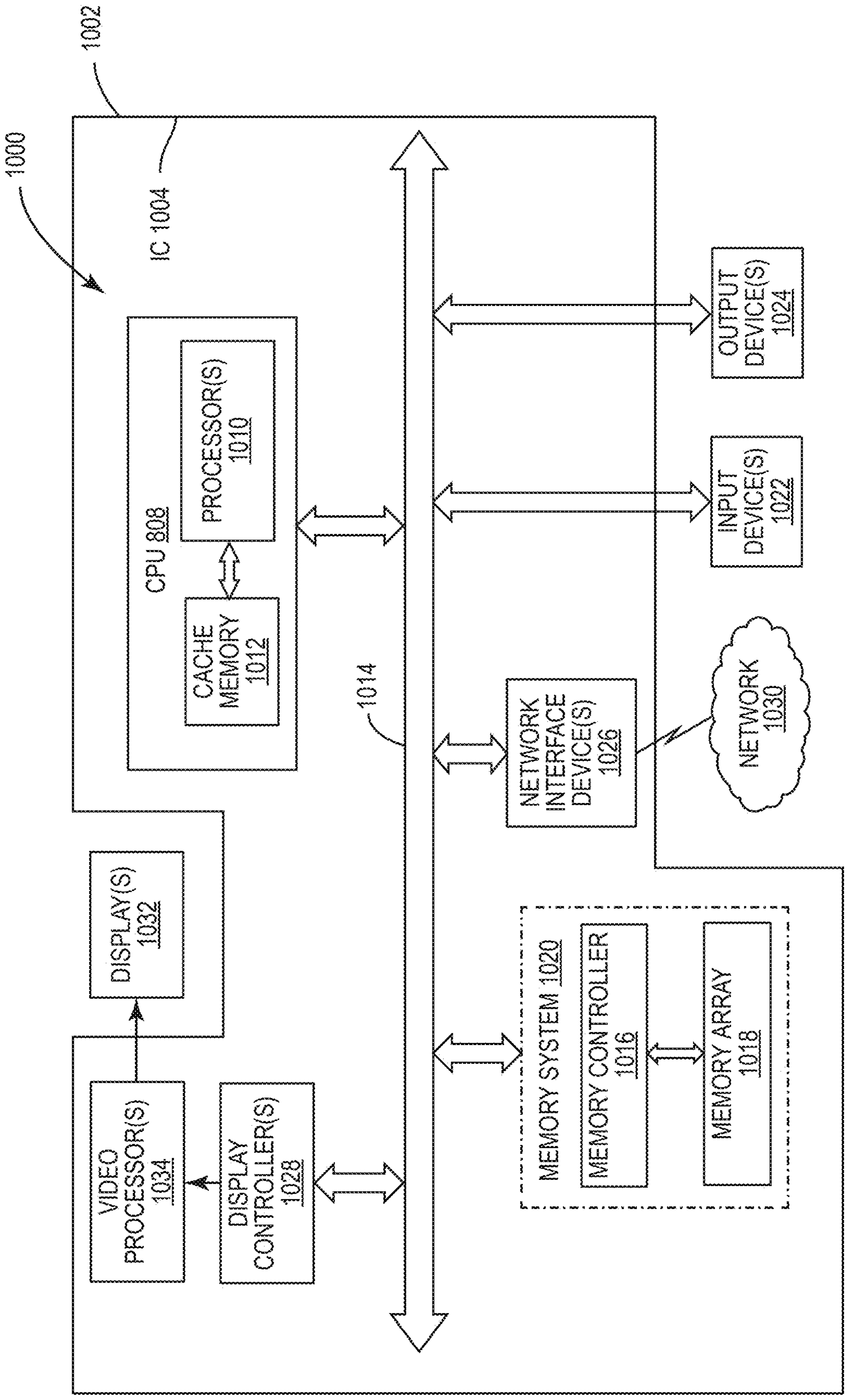
FIG. 10 is a block diagram of an exemplary wireless communication device that includes radio-frequency (RF) components that can be disposed on ICs, including a multi-mode SAW filter, including unified insulating elements disposed between interconnects coupled to different voltages.

In this regard, FIG. 10 illustrates an example of a processor-based system 1000 that can include ICs including multi-mode SAW filters in which multiple overlap locations of interconnects at different voltages are insulated from each other by a multi-track unified insulating element, as shown in any of FIGS. 3A, 5, and 6. The processor-based system 1000 includes a central processing unit (CPU) 1008 that includes one or more processors 1010, which may also be referred to as CPU cores or processor cores. The CPU 1008 may have cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016, as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow an exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display (s) 1032 to be displayed via one or more video processor(s) 1034, which processes the information to be displayed into a format suitable for the display(s) 1032. The display(s) 1032 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. The devices and components described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A multi-mode surface acoustic wave (SAW) filter, comprising:
   an interdigital transducer (IDT) row (IDT row) comprising first IDTs alternately disposed with second IDTs, each IDT of the IDT row comprising a first-side track on a first side of the IDT row and a second-side track on a second side of the IDT row opposite to the first side;
   a first interconnect on the first side of the IDT row and electrically coupled to the first-side track of a first one of the first IDTs and first-side track of a second one of the first IDTs;
   a second interconnect on the first side of the IDT row and coupled to the first-side track of a first one of the second IDTs disposed between the first one of the first IDTs and the second one of the first IDTs;
   a first overlap location wherein the second interconnect overlaps the first interconnect coupled to the first-side track of the first one of the first IDTs;
   a second overlap location wherein the second interconnect overlaps the first interconnect coupled to the first-side track of the second one of the first IDTs; and
   a first unified insulating element disposed between the first interconnect and the second interconnect in the first overlap location and the second overlap location.
2. The multi-mode SAW filter of clause 1, further comprising a plurality of overlap locations at which the second interconnect overlaps the first interconnect coupled to the first-side track of each of the first IDTs, wherein the first unified insulating element is disposed between the first interconnect and the second interconnect at the plurality of overlap locations.
3. The multi-mode SAW filter of clause 1 or clause 2, wherein:
   the first interconnect comprises:
      a first segment;
      a second segment extending from the first segment and coupled to the first-side track of the first one of the second IDTs; and
      a third segment extending from the first segment and coupled to the first-side track of a second one of the second IDTs;
   the second interconnect comprises a fourth segment extending on the first side of the IDT row and coupled to the first-side track of the first one of the second IDTs; and
   the first unified insulating element extends between the first overlap location and the second overlap location.
4. The multi-mode SAW filter of clause 3, wherein the second interconnect is disposed between the first segment and the IDT row.
5. The multi-mode SAW filter of clause 3 or clause 4, wherein the second interconnect is disposed directly over the first segment.
6. The multi-mode SAW filter of clause 3, further comprising:
   a third interconnect comprising:
      a fifth segment extending on the second side of the IDT row;
      a sixth segment extending from the fifth segment and coupled to the second-side track of the first one of the first IDTs; and
      a seventh segment extending from the fifth segment and coupled to the second-side track of the second one of the second IDTs, wherein the second one of the first IDTs is disposed between the first one of the second IDTs and the second one of the second IDTs;
   the second interconnect comprising an eighth segment extending on the second side of the IDT row and coupled to:
      the fourth segment;
      the second-side track of the first one of the first IDTs; and
      the second-side track of the second one of the first IDTs; and
   a second unified insulating element disposed between the third interconnect and the eighth segment in a third overlap location in which the eighth segment of the second interconnect overlaps the sixth segment of the third interconnect, and a fourth overlap location in which the eighth segment of the second interconnect overlaps the seventh segment of the third interconnect.
7. The multi-mode SAW filter of clause 4, wherein:
   the second interconnect is configured to couple to a reference voltage;
   the first interconnect is configured to receive an input signal; and
   the third interconnect is configured to generate an output signal.
8. The multi-mode SAW filter of any of clause 1 to clause 3, further comprising:
   a third interconnect extending on the first side of the IDT row and coupled to the first-side track of a second one of the second IDTs and the first-side track of a third one of the second IDTs; and
   a second unified insulating element disposed between the second interconnect and the third interconnect in the third direction at the first overlap location and the second overlap location.
9. The multi-mode SAW filter of clause 8, wherein the first one of the first IDTs, the second one of the first IDTs, and the first one of the second IDTs are disposed between the second one of the second IDTs and the third one of the second IDTs.
10. The multi-mode SAW filter of any of clause 1 to clause 3, further comprising:
   a third interconnect disposed on the first side of the IDT row;
   a fourth interconnect and a fifth interconnect, each disposed on the second side of the IDT row; and
   a second, a third, and a fourth unified insulating element;
   wherein:
      the second interconnect comprises:
         a first segment on the first side of the IDT row configured to couple a first voltage to the first-side track of each of the first IDTs; and
         a second segment on the second side of the IDT row configured to couple the first voltage to the second-side track of each of the second IDTs;
      the first interconnect is configured to provide a second voltage to the first-side track of at least one of the first IDTs;
      the third interconnect is configured to provide a third voltage to the first-side track of at least one of the second IDTs;
      the second unified insulating element is disposed between the first segment of the second interconnect, and the third interconnect;

the third unified insulating element is disposed between the second segment of the second interconnect and the fourth interconnect; and the fourth unified insulating element is disposed between the fourth interconnect and the fifth interconnect.

11. The multi-mode SAW filter of any of clause 1 to clause 10, further comprising a substrate, wherein:

the first interconnect comprises a first metal layer disposed on a surface of the substrate; and the second interconnect comprises a second metal layer disposed on the substrate after the first metal layer.

12. The multi-mode SAW filter of any of clause 1 to clause 11, further comprising:

a substrate; and a piezoelectric layer on the substrate;

wherein the IDT row is disposed on the piezoelectric layer.

13. The multi-mode SAW filter of any of clause 1 to clause 12, wherein:

the first unified insulating element comprises a first insulating layer disposed on the first interconnect and a linear edge facing the IDT row.

14. The multi-mode SAW filter of any of clause 1 to clause 13, wherein:

the second interconnect is disposed on the first insulating layer; and the first unified insulating element comprises a first width wider than a second width of the first interconnect.

15. The multi-mode SAW filter of clause 13 or clause 14, wherein:

the second interconnect includes a first region extending to contact the first-side track of the first one of the second IDTs between the linear edge of the first insulating layer and the first side of the IDT row.

16. The multi-mode SAW filter of any of clause 1 to clause 15, wherein:

the first unified insulating element comprises a first insulating layer extending on the first side of the IDT row;

the second interconnect is disposed on the first insulating layer;

openings extend through the first insulating layer from the first-side tracks of each of the first IDTs; and vertical interconnects extending through the openings in the first insulating layer couple the first-side track of each of the first IDTs to the second interconnect.

17. The multi-mode SAW filter of clause 1, further comprising a third interconnect coupled to the second-side track of each IDT of the IDT row.

18. The multi-mode SAW filter of clause 10, further comprising a sixth interconnect, wherein:

the fourth interconnect is configured to provide the first voltage to the second-side track of at least one of the first IDTs;

the fifth interconnect is configured to provide the second voltage to the second-side track of at least one of the second IDTs; and the sixth interconnect is configured to provide the third voltage to the second-side track of at least one of the first IDTs.

19. The multi-mode SAW filter of clause 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

20. A method of manufacturing a multi-mode surface acoustic wave (SAW) filter, the method comprising:

forming an interdigital transducer (IDT) row (IDT row) comprising first IDTs alternately disposed with second IDTs each IDT of the IDT row comprising a first-side track on a first side of the IDT row and a second-side track on a second side of the IDT row opposite to the first side;

forming a first interconnect extending on the first side of the IDT row and electrically coupled to the first-side track of a first one of the first IDTs and the first-side track of a second one of the first IDTs;

forming a second interconnect extending on the first side of the IDT row and coupled to the first-side track of a first one of the second IDTs disposed between the first one of the first IDTs and the second one of the first IDTs;

forming a first overlap location wherein the second interconnect overlaps the first interconnect coupled to the first-side track of the first one of the first IDTs;

forming a second overlap location wherein the second interconnect overlaps the first interconnect coupled to the first-side track of the second one of the first IDTs; and forming a first unified insulating element disposed between the first interconnect and the second interconnect in the first overlap location and the second overlap location.

21. The method of clause 18, wherein:

forming the first interconnect further comprises:

forming a first segment;

forming a second segment extending from the first segment and coupled to the first-side track of the first one of the first IDTs on the first side of the IDT row; and forming a third segment extending from the first segment and coupled to the first-side track of the second one of the first IDTs on the first side of the IDT row; and forming the first unified insulating element further comprises forming a first insulating layer extending from the first overlap location to the second overlap location.

22. An integrated circuit (IC) chip, comprising:

a substrate;

a piezoelectric layer disposed on the substrate; and a multi-mode surface acoustic wave (SAW) filter on the piezoelectric layer, comprising:

an interdigital transducer (IDT) row (IDT row) comprising first IDTs alternately disposed with second IDTs, each IDT of the IDT row comprising a first-side track on a first side of the IDT row and a second-side track on a second side of the IDT row opposite to the first side;

a first interconnect on the first side of the IDT row and electrically coupled to the first-side track of a first one of the first IDTs and to the first-side track of a second one of the first IDTs;

a second interconnect on the first side of the IDT row and coupled to a first-side track of a first one of the second IDTs disposed between the first one of the first IDTs and the second one of the first IDTs;

a first overlap location wherein the second interconnect overlaps the first interconnect coupled to the first-side track of the first one of the first IDTs;

a second overlap location wherein the second interconnect overlaps the first interconnect coupled to the first-side track of the second one of the first IDTs; and a first unified insulating element disposed between the first interconnect and the second interconnect in the first overlap location and the second overlap location.

What is claimed is:

1. A multi-mode surface acoustic wave (SAW) filter, comprising:

an interdigital transducer (IDT) row (IDT row) comprising first IDTs alternately disposed with second IDTs, each IDT of the IDT row comprising a first-side track on a first side of the IDT row and a second-side track on a second side of the IDT row opposite to the first side;

a first interconnect extending on the first side of the IDT row and electrically coupled to the first-side track of a first one of the first IDTs and first-side track of a second one of the first IDTs;

a second interconnect extending on the first side of the IDT row and coupled to the first-side track of a first one of the second IDTs disposed between the first one of the first IDTs and the second one of the first IDTs;

a first overlap location wherein the second interconnect overlaps the first interconnect coupled to the first-side track of the first one of the first IDTs;

a second overlap location wherein the second interconnect overlaps the first interconnect coupled to the first-side track of the second one of the first IDTs;

a first unified insulating element disposed between the first interconnect and the second interconnect in the first overlap location and the second overlap location;

a third interconnect extending on the first side of the IDT row and coupled to the first-side track of a second one of the second IDTs and the first-side track of a third one of the second IDTs; and a second unified insulating element disposed between the second interconnect and the third interconnect at the first overlap location and the second overlap location.

2. The multi-mode SAW filter of claim 1, further comprising a plurality of overlap locations at which the second interconnect overlaps the first interconnect coupled to the first-side track of each of the first IDTs, wherein the first unified insulating element is disposed between the first interconnect and the second interconnect at the plurality of overlap locations.

3. The multi-mode SAW filter of claim 1, wherein:

the first interconnect comprises:

a first segment;

a second segment extending from the first segment and coupled to the first-side track of the first one of the first IDTs; and a third segment extending from the first segment and coupled to the first-side track of the second one of the first IDTs;

the second interconnect comprises a fourth segment extending on the first side of the IDT row and coupled to the first-side track of the first one of the second IDTs; and the first unified insulating element extends between the first overlap location and the second overlap location.

4. The multi-mode SAW filter of claim 3, wherein the second interconnect is disposed directly over the first segment.

5. The multi-mode SAW filter of claim 3, further comprising:

a fourth interconnect comprising:

a fifth segment extending on the second side of the IDT row;

a sixth segment extending from the fifth segment and coupled to the second-side track of the first one of the first IDTs; and a seventh segment extending from the fifth segment and coupled to the second-side track of a third one of the first IDTs, wherein the second one of the second IDTs is disposed between the first one of the second IDTs and the third one of the first IDTs;

the first interconnect comprising an eighth segment extending on the second side of the IDT row and coupled to:

the first segment;

the second-side track of the first one of the second IDTs; and the second-side track of the second one of the second IDTs; and a third unified insulating element disposed between the fifth segment of the fourth interconnect and the eighth segment of the first interconnect.

6. The multi-mode SAW filter of claim 5, wherein:

the first interconnect is configured to couple to a reference voltage;

the second interconnect is configured to receive a first input signal;

the third interconnect is configured to receive a second input signal; and the fourth interconnect is configured to generate an output signal.

7. The multi-mode SAW filter of claim 1, further comprising:

a fourth interconnect and a fifth interconnect, each disposed on the second side of the IDT row; and a second, a third, and a fourth unified insulating element; wherein:

the first interconnect comprises:

a first segment on the first side of the IDT row configured to couple a first voltage to the first-side track of each of the first IDTs; and a second segment on the second side of the IDT row configured to couple the first voltage to the second-side track of each of the second IDTs;

the second interconnect is configured to provide a second voltage to the first-side track of at least one of the second IDTs;

the third interconnect is configured to provide a third voltage to the first-side track of at least one of the second IDTs;

the first unified insulating element is disposed between the first segment of the first interconnect, and the second interconnect;

the second unified insulating element is disposed between the second interconnect and the third interconnect;

the third unified insulating element is disposed between the second segment of the first interconnect and the fourth interconnect; and the fourth unified insulating element is disposed between the fourth interconnect and the fifth interconnect.

8. The multi-mode SAW filter of claim 1, further comprising a substrate, wherein:

the first interconnect comprises a first metal layer disposed on a surface of the substrate; and the second interconnect comprises a second metal layer disposed on the substrate after the first metal layer.

9. The multi-mode SAW filter of claim 1, further comprising:

a substrate; and a piezoelectric layer on the substrate;

wherein the IDT row is disposed on the piezoelectric layer.

10. The multi-mode SAW filter of claim 1, wherein:

the first unified insulating element comprises a first insulating layer disposed on the first interconnect and comprises a linear edge facing the IDT row.

11. The multi-mode SAW filter of claim 1, wherein:

the second interconnect is disposed on the first insulating layer; and the first unified insulating element comprises a first width wider than a second width of the first interconnect.

12. The multi-mode SAW filter of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; an avionics system; a drone; and a multicopter.

13. A method of manufacturing a multi-mode surface acoustic wave (SAW) filter, the method comprising:

forming an interdigital transducer (IDT) row (IDT row) comprising first IDTs alternately disposed with second IDTs, each IDT of the IDT row comprising a first-side track on a first side of the IDT row and a second-side track on a second side of the IDT row opposite to the first side;

forming a first interconnect extending on the first side of the IDT row and electrically coupled to the first-side track of a first one of the first IDTs and the first-side track of a second one of the first IDTs;

forming a second interconnect extending on the first side of the IDT row and coupled to the first-side track of a first one of the second IDTs disposed between the first one of the first IDTs and the second one of the first IDTs;

forming a first overlap location wherein the second interconnect overlaps the first interconnect coupled to the first-side track of the first one of the first IDTs;

forming a second overlap location wherein the second interconnect overlaps the first interconnect coupled to the first-side track of the second one of the first IDTs;

forming a first unified insulating element disposed between the first interconnect and the second interconnect in the first overlap location and the second overlap location;

forming a third interconnect extending on the first side of the IDT row and coupled to the first-side track of a second one of the second IDTs and the first-side track of a third one of the second IDTs; and forming a second unified insulating element disposed between the second interconnect and the third interconnect at the first overlap location and the second overlap location.

14. The method of claim 13, wherein:

forming the first interconnect further comprises:

forming a first segment;

forming a second segment extending from the first segment and coupled to the first-side track of the first one of the first IDTs on the first side of the IDT row; and forming a third segment extending from the first segment and coupled to the first-side track of the second one of the first IDTs on the first side of the IDT row; and forming the first unified insulating element further comprises forming a first insulating layer extending from the first overlap location to the second overlap location.

15. An integrated circuit (IC) chip, comprising:

a substrate;

a piezoelectric layer disposed on the substrate; and a multi-mode surface acoustic wave (SAW) filter on the piezoelectric layer, comprising:

an interdigital transducer (IDT) row (IDT row) comprising first IDTs alternately disposed with second IDTs, each IDT of the IDT row comprising a first-side track on a first side of the IDT row and a second-side track on a second side of the IDT row opposite to the first side;

a first interconnect on the first side of the IDT row and electrically coupled to the first-side track of a first one of the first IDTs and to the first-side track of a second one of the first IDTs;

a second interconnect on the first side of the IDT row and coupled to a first-side track of a first one of the second IDTs disposed between the first one of the first IDTs and the second one of the first IDTs;

a first overlap location wherein the second interconnect overlaps the first interconnect coupled to the first-side track of the first one of the first IDTs;

a second overlap location wherein the second interconnect overlaps the first interconnect coupled to the first-side track of the second one of the first IDTs;

a first unified insulating element disposed between the first interconnect and the second interconnect in the first overlap location and the second overlap location;

a third interconnect extending on the first side of the IDT row and coupled to the first-side track of a second one of the second IDTs and the first-side track of a third one of the second IDTs; and a second unified insulating element disposed between the second interconnect and the third interconnect at the first overlap location and the second overlap location.

* * * * *